United States Patent
Ishida et al.

(10) Patent No.: US 7,015,759 B2
(45) Date of Patent: Mar. 21, 2006

(54) AGC CIRCUIT

(75) Inventors: Takuma Ishida, Osaka (JP); Keiichi Fujii, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 52 days.

(21) Appl. No.: 10/899,006

(22) Filed: Jul. 27, 2004

(65) Prior Publication Data

US 2005/0030099 A1    Feb. 10, 2005

(30) Foreign Application Priority Data

Aug. 6, 2003    (JP)    ............................ 2003-287926

(51) Int. Cl.
    *H03G 3/10*    (2006.01)
(52) U.S. Cl. ...................................... 330/279; 330/278
(58) Field of Classification Search ............... 330/279, 330/129, 278, 135, 138; 455/140, 126, 127
    See application file for complete search history.

(56) References Cited

U.S. PATENT DOCUMENTS

| | | | |
|---|---|---|---|
| 5,179,353 A * | 1/1993 | Miyake | ........................ 330/129 |
| 5,566,363 A | 10/1996 | Senda | |
| 5,752,171 A | 5/1998 | Akiya | |
| 6,038,432 A | 3/2000 | Onoda | |
| 6,057,732 A | 5/2000 | Morishita | |
| 6,577,852 B1 * | 6/2003 | Iwata et al. | ............... 455/240.1 |
| 6,847,261 B1 * | 1/2005 | Iwata et al. | .................. 330/279 |
| 2004/0178851 A1 | 9/2004 | Ishida et al. | |

FOREIGN PATENT DOCUMENTS

JP    8-116226    5/1996

* cited by examiner

*Primary Examiner*—Henry Choe
(74) *Attorney, Agent, or Firm*—McDermott Will & Emery LLP

(57) ABSTRACT

An AGC circuit of the present invention includes a first up/down counter for converting the amount of change in an output voltage higher than a threshold voltage into a count value and controlling a gain of a variable gain amplifier circuit and a second up/down counter to which a reference clock having a lower frequency than that of a reference clock supplied to the first up/down counter is supplied. Count values of the first and second up/down counters are D/A-converted and then compared with each other by a voltage comparator. An up/down count of the first up/down counter is controlled based on a comparison result and the gain of the variable gain amplifier circuit is controlled using only a signal based on the count value of the first up/down counter, thereby suppressing distortion of an output waveform and the generation of a frequency signal which is not originally input.

20 Claims, 24 Drawing Sheets

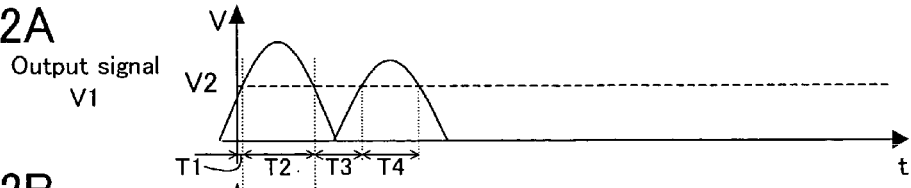
FIG.2A Output signal V1
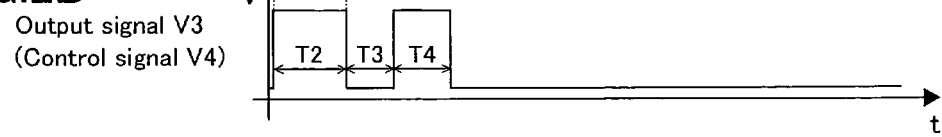
FIG.2B Output signal V3 (Control signal V4)
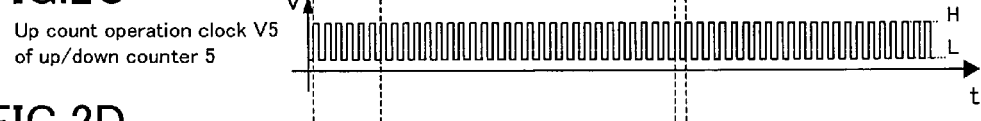
FIG.2C Up count operation clock V5 of up/down counter 5
FIG.2D Down count operation clock V6 of up/down counter 5
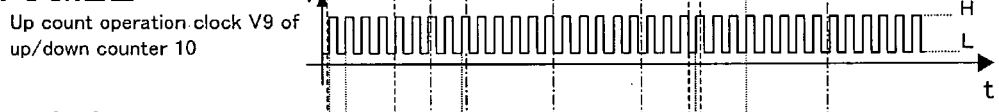
FIG.2E Up count operation clock V9 of up/down counter 10
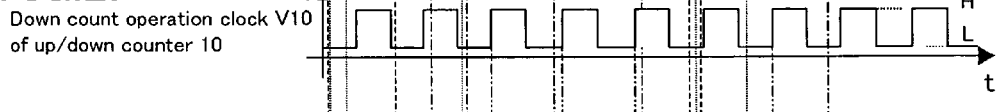
FIG.2F Down count operation clock V10 of up/down counter 10
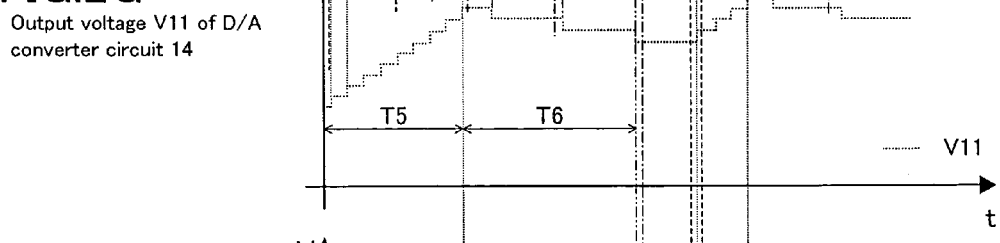
FIG.2G Output voltage V11 of D/A converter circuit 14
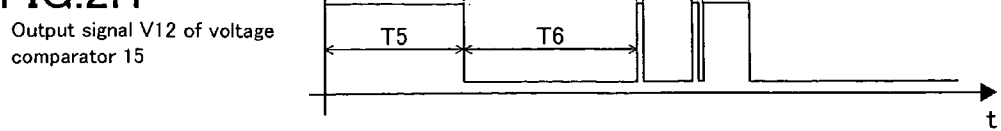
FIG.2H Output signal V12 of voltage comparator 15

Input signal VA

Output signal VB in FIG. 1

Output voltages V7 and V11 of D/A converter circuits 9 and 14 in FIG. 1

— V7
---- V11

Clock switch control input V12 in FIG. 1 (Output of voltage comparator 15)

Output signal VB in FIG. 7

Output voltages V7 and V11 of D/A converter circuits 9 and 14 in FIG. 7

— V7
---- V11
---- V11+ΔV1

Clock switch control input V16 in FIG. 7 (Output of voltage comparator 26)

FIG.16A
Input signal VA

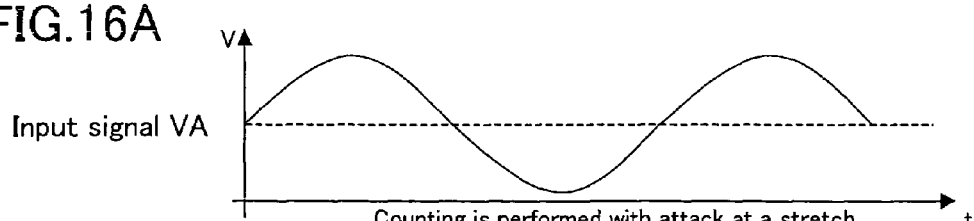

FIG.16B
Output signal VB in FIG. 7

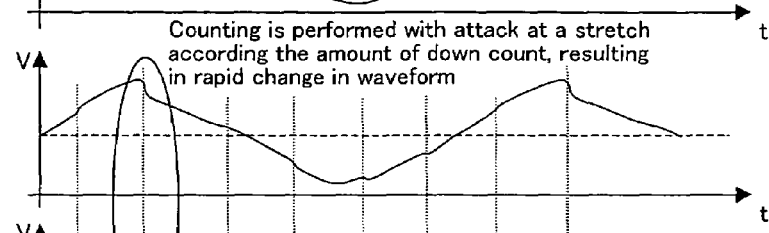

Counting is performed with attack at a stretch according the amount of down count, resulting in rapid change in waveform

FIG.16C
Output voltages V7 and V11 of D/A converter circuits 9 and 14 in FIG. 7

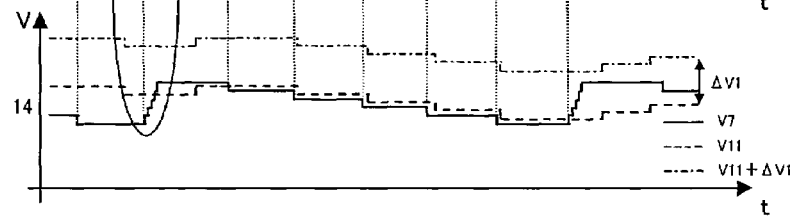

FIG.16D
Relationship between frequency of V6 and each of V16 and V18 in FIG. 15

FIG.16E
Relationship between voltage of V7 and frequency of V6 in FIG. 15

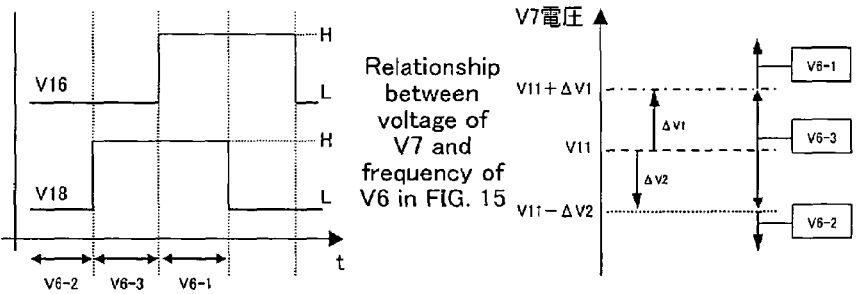
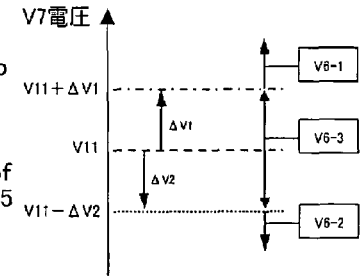

FIG.16F
Output signal VB in FIG. 15

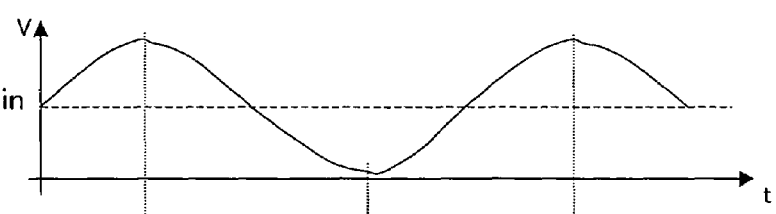

FIG.16G
Output voltages V7 and V11 of D/A converter circuits 9 and 14 in FIG. 15

Output signal VB

Output signal V101

Output signal V104
(Control signal V104)

Up count operation clock V105

Down count operation clock V106

Output voltage V107 of D/A converter circuit

FIG.24A Output signal V103 (Control signal V104)

FIG.24B Up count operation clock V105 of up/down counter 105

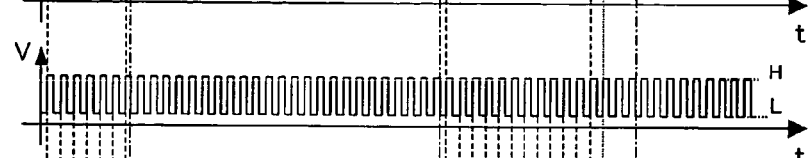

FIG.24C Down count operation clock V106 of up/down counter 105

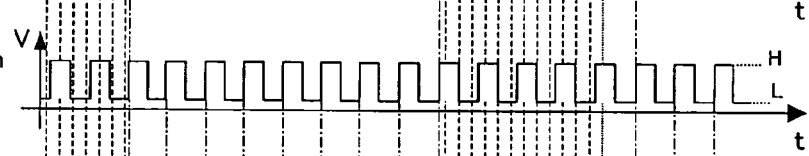

FIG.24D Up count operation clock V109 of up/down counter 110

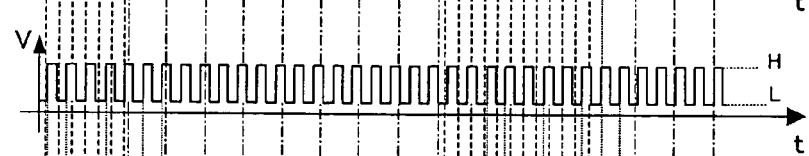

FIG.24E Down count operation clock V110 of up/down counter 110

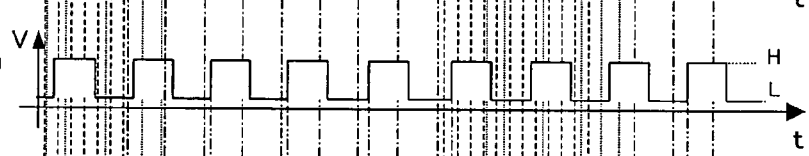

FIG.24F Output voltages V107 and V111 of D/A converter circuits 109 and 114

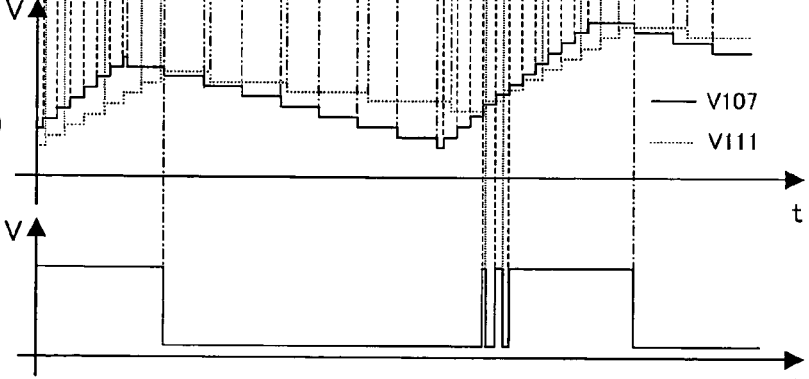

—— V107
······ V111

FIG.24G Output signal V112 of voltage comparator 115

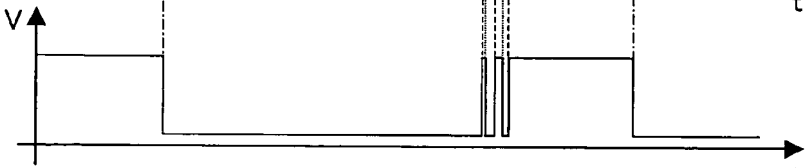

FIG.24H Output voltage of switch circuit 116

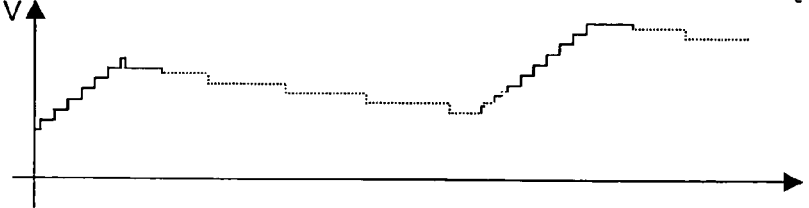

FIG.24I Gain control voltage V113

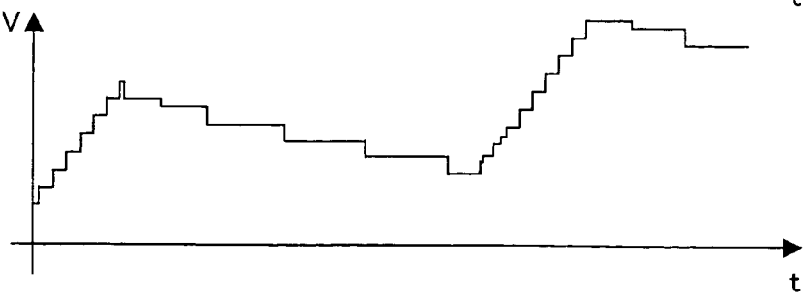

AGC CIRCUIT

BACKGROUND OF THE INVENTION

The present invention relates to an AGC (automatic gain control) circuit for suppressing fluctuation of an input signal by controlling the gain of a variable gain amplifier circuit, in a communication system or a speech system, according to the amplitude of the input signal so that the amplitude of an output signal becomes constant.

An AGC circuit controls the amplitude of an input signal which fluctuates due to a variety of causes to a constant amplitude by an amplifier for controlling a gain and outputs the controlled signal. For example, an AGC circuit having a configuration using an integrator circuit with a capacitor is disclosed in Japanese Laid-Open Publication No. 8-116226.

SUMMARY OF THE INVENTION

As an inventive AGC circuit, the present applicant has proposed an AGC circuit which does not use an integrator circuit with a capacitor as an AGC circuit in Japanese Patent Application No. 2003-064980. FIG. 22 is a block diagram illustrating an example of the AGC circuit. Hereinafter, an AGC circuit which does not use an integrator circuit with a capacitor will be described with reference to FIG. 22.

In FIG. 22, A1 denotes a signal input terminal to which an input signal VA is supplied. The reference numeral 101 denotes a variable gain amplifier circuit for amplifying or diminishing a voltage of the input signal VA according to a gain controlled by a gain control voltage V113 and outputting an output signal VB. B1 denotes an output terminal of the variable gain amplifier circuit 101. The reference numeral 102 denotes a rectifier circuit for rectifying an output voltage of the variable gain amplifier circuit 101. The reference numeral 103 is a first voltage comparator for comparing a rectified signal (output signal) V101 rectified by the rectifier circuit 102 with an arbitrary threshold voltage V102 which has been set beforehand and outputting the voltage V103 at a high level when the output signal V103 is higher than the threshold voltage V102 and a voltage V103 at a low level when the output signal V103 is lower than the threshold voltage V102. The reference numeral 104 denotes a threshold voltage input terminal for inputting a threshold voltage V102 to the voltage comparator 103. The reference numeral 105 denotes a first up/down counter. The reference numeral 106 denotes an up/down operation control input terminal for receiving the output voltage V103 of the first voltage comparator 103 as a control signal V104, thereby controlling an up/down operation (the counting direction) of the first up/down operation of the up/down counter 105. The reference numeral 107 denotes an input terminal for inputting an up count operation clock V105 to the first up/down counter 105. The reference numeral 108 denotes an input terminal for inputting a down count operation clock V106 to the first up/down counter 105. The reference numeral 109 denotes a first D/A converter circuit for outputting a direct current voltage V107 according to a count value C of the first up/down counter 105. The reference numeral 110 denotes a second up/down counter. The reference numeral 111 denotes an up/down operation control input terminal for receiving a control signal V108, thereby controlling the counting direction of the second up/down counter 110. The reference numeral 112 denotes an up count operation clock input terminal for inputting an up count operation clock V109 to the second up/down counter 110. The reference numeral 113 denotes a down count operation clock input terminal for inputting a down count operation clock V110 to the second up/down counter 110. The reference numeral 114 denotes a second D/A converter circuit for outputting a direct current voltage V111 according to a count value D of the second up/down counter 110. The reference numeral 115 denotes a second comparator for comparing an output voltage V107 of the first D/A converter circuit 109 with an output voltage V111 of the second D/A converter circuit 114. The second voltage comparator 115 outputs a voltage V112 at the high or low level according to a result obtained from comparison between the voltages V107 and V111 and controls an up/down operation of the second up/down counter 110. The reference numeral 116 denotes a switch circuit for receiving the voltage V112 as an input and transmitting the higher one of the output voltage V107 of the first D/A converter circuit 109 and the output voltage V111 of the second D/A converter circuit 114 to a direct current amplifier circuit 117. The direct current amplifier circuit 117 amplifies the higher one of the voltages V107 and V111 and outputs the amplified voltage as the gain control voltage V113. The gain control voltage V113 is given to the variable gain amplifier control circuit 101.

Hereinafter, the operation of a known AGC circuit formed to have the above-described configuration will be described with reference to FIG. 23.

The input signal VA is amplified or diminished by the variable gain amplifier circuit 101 to be an output signal VB having a waveform shown in FIG. 23A. The output signal VB is rectified by the rectifier circuit 102 to be an output signal V101 having a waveform shown in FIG. 23B.

Next, the output signal V101 of the rectifier circuit 102 is received by the voltage comparator 103. The voltage comparator 103 compares the output signal V101 of the rectifier circuit 102 and a threshold voltage V102 and outputs as the output signal V103 a high level voltage when the output signal V101 is higher than the threshold voltage V102 and a low level voltage when the output signal V101 is lower than the threshold voltage V102.

The output signal V103 is received by the up/down operation control input terminal 106 of the up/down counter 105 in the subsequent stage to be a control signal V104 for controlling up count and down count operations of the up/down counter 105.

The up/down counter 105 performs an up count operation according to an up count frequency set by the up count operation clock V105 having a waveform shown in FIG. 23D in a period T1 in which the control signal (voltage) V104 is the high level. Moreover, in a period T2 in which the control signal (voltage) V104 is the low level, a down count operation is performed according to a down count frequency set by the down count operation clock V106 having a waveform shown in FIG. 23E.

The count C counted by the up/down counter 105 is received by the D/A converter circuit 109. The D/A converter circuit 109 outputs a direct current voltage V107 having a waveform shown in FIG. 23F according to the count value C of the up/down counter 105. Moreover, at this time, the up/down counter 110 performs an up count operation according to the up count frequency set by the up count operation clock V109 in a period in which the control signal (voltage) V108 to be received by the up/down operation control input terminal 111, i.e., the output voltage V112 of the second voltage comparator 115 is the high level and performs a down count operation according to the down count frequency set by the down count operation clock V110 in a period in which the output signal (voltage) V112 is the low level. The count value D counted by the up/down counter 110 is received by the D/A converter circuit 114. The D/A converter circuit 114 outputs the direct current voltage V111 according to the count value D.

The higher one of the direct current voltages V107 and V111 is transmitted to the direct current amplifier circuit 117 by the switch circuit 116 and amplified to an arbitrary size by the direct amplifier circuit 117 to be the gain control voltage V113 of the variable gain amplifier circuit 101.

Furthermore, the direct current voltages V107 and V111 are compared with each other by the voltage comparator 115. The voltage comparator 115 outputs the voltage V112 at the high level when the direct current voltage V107 is higher than the direct current voltage V111 and outputs the voltage V112 at the low level in other cases. The output voltage V112 serves as the control signal V108 for controlling an up/down operation of the up/down counter 110. Then, the switch circuit 116 is controlled by the voltage V112, the gain of the variable gain amplifier circuit 101 is changed by the gain control voltage V113 and the input signal VA is amplified or diminished. The above-described operation is repeated until a time when amplification and diminishment of the input signal VA by the first up/down counter 105 or the second up/down counter 110 balance out each other, and the output voltage VB converges to a certain amplitude level.

FIGS. 24A through 24I are respective waveform charts of outputs from members of the AGC circuit, the waveform charts showing the relation between the up/down counter 105 and the up/down counter 110. FIG. 24A illustrates the waveform of the output signal V103 of the voltage comparator 103. FIG. 24B illustrates the waveform of the up count operation clock V105 to be received by the up/down counter 105. FIG. 24C illustrates the waveform of the down count operation clock V106 to be received by the up/down counter 105. FIG. 24D illustrates the waveform of the up count operation clock V109 to be received by the up/down counter 110. FIG. 24E illustrates the waveform of the down count operation clock V110 to be received by the up/down counter 110; FIG. 24F illustrates the respective waveforms of the output voltages V107 and V111 of the D/A converter circuits 109 and 114. FIG. 24G illustrates the waveform of the output signal V112 of the voltage comparator 115. FIG. 24H illustrates the waveform of an output of the switch circuit 116. FIG. 24I illustrates the waveform of the gain control voltage V113. FIGS. 24G and 24H show that the respective output voltages V107 and V111 of the D/A converter circuit 109 and 114 selectively appear as output voltages of the switch circuit 116 according to the level of the output signal V112 of the voltage comparator 115.

However, the AGC circuit has the following problems. When the voltage comparator 115 has a large input offset, a difference between the V107 and V111 to be transmitted by the switch circuit 116 is increased and a change in the gain control signal V113 at a switching time is increased. Thus, distortion of an output waveform of the variable gain control circuit 101 and the generation of a frequency signal not originally input are caused (in a speech signal, an abnormal sound is generated and auditory discomfort is caused). Moreover, switching noise of the switch circuit 116 itself and the like also causes distortion or an abnormal sound in the same manner.

The present invention has been devised to solve the above-described problems and it is therefore an object of the present invention to provide AGC properties including more excellent noise resistance in an AGC circuit which does not require an integrator circuit using a capacitor.

To solve the above-described problems, according to the present invention, feedback of an input signal to a gain control circuit is performed not by switching a plurality of signals but by inputting only an output voltage according to a first up/down counter.

Specifically, an AGC circuit according to the present invention includes: a variable gain amplifier circuit having a gain controlled by a gain control signal; a rectifier circuit for rectifying an output signal of the variable gain amplifier circuit; a first voltage comparator for comparing a rectified signal rectified by the rectifier circuit with a voltage arbitrarily set beforehand; a first up/down counter for switching between an up count operation and a down count operation according to a level of an output voltage of the first voltage comparator; a first D/A converter circuit for outputting a voltage according to a count value of the first up/down counter; a second up/down counter for switching between an up count operation and a down count operation according to a level of an output voltage of a second voltage comparator; a second D/A converter circuit for outputting a voltage according to a count value of the second up/down counter; a second voltage comparator for comparing an output voltage of the first D/A converter circuit with an output voltage of the second D/A converter circuit; and a clock switch circuit for switching a count operation clock frequency of the first up/down counter based on the level of the output voltage of the second voltage comparator. In the AGC circuit, a gain control signal according to the output voltage of the first D/A converter circuit is supplied to the variable gain amplifier circuit.

In one embodiment of the AGC circuit according to the present invention, a first register is provided between the first voltage comparator and the first up/down counter, and the AGC circuit is configured for storing the output voltage of the first voltage comparator in the first register with a cycle of a first reference clock, switching an operation of the first up/down counter between the up count operation and the down count operation according to a level of the voltage stored in the first register, and not transmitting a change in the output voltage of the first voltage comparator in a shorter period than the cycle of the first reference clock to the first up/down counter.

In another embodiment of the AGC circuit according to the present invention, a second register is provided between the second voltage comparator and the second up/down counter, and the AGC circuit is configured for storing the output voltage of the second voltage comparator in the second register with a cycle of a second reference clock, switching an operation of the second up/down counter between the up count operation and the down count operation according to a level of the voltage stored in the second register, and not transmitting a change in the output voltage of the second voltage comparator in a shorter period than the cycle of the second reference clock to the second up/down counter.

In another embodiment of the AGC circuit according to the present invention, a first count operation control circuit is provided between the first voltage comparator and the first up/down counter, according to the count value of the first up/down counter, the AGC circuit transmits the output voltage of the first voltage comparator to the first up/down counter or cuts off a transmission of the output voltage, thereby limiting the count value of the first up/down counter to within a range from a predetermined first upper limit value to a predetermined first lower limit value, a second count operation control circuit is provided between the second voltage comparator and the second up/down counter, and according to the count value of the second up/down counter, the AGC circuit transmits the output voltage of the second voltage comparator to the second up/down counter or cuts off a transmission of the output voltage, thereby limiting the count value of the second up/down counter to within a range from a predetermined second upper limit value to a predetermined second lower limit value.

In another embodiment of the AGC circuit according to the present invention, a first count operation control circuit is provided between the first register and the first up/down counter, according to the count value of the first up/down counter, the AGC circuit transmits the output voltage of the first register to the first up/down counter or cuts off a transmission of the output, thereby limiting the count value of the first up/down counter to within a range from a predetermined first upper limit value and a predetermined first lower limit value, a second count operation circuit is provided between the second register and the second up/down counter, and according to the count value of the second up/down counter, the AGC circuit transmits the output voltage of the second register or cuts off a transmission of the output, thereby limiting the count value of the second up/down counter to within a range from a predetermined second upper limit value to a predetermined second lower limit value.

In another embodiment of the AGC circuit according to the present invention, the first up/down counter has the function of limiting the count value to within a range from a predetermined first upper limit value to a first lower limit value by executing the up count operation or stopping an execution of the up count operation according to the count value while executing a down count operation or stopping an execution of the down count operation according to the count value, and the second up/down counter has the function of limiting the count value to within a range from a predetermined second upper limit value to a second lower limit value by executing the up count operation or stopping the execution according to the count value while executing a down count operation or stopping the execution according to the count value.

An AGC circuit according to the present invention includes: a variable gain amplifier circuit having a gain controlled by a gain control signal; a rectifier circuit for rectifying an output signal of the variable gain amplifier circuit; a first voltage comparator for comparing a rectified signal rectified by the rectifier circuit with a voltage arbitrarily set beforehand; a first up/down counter for switching between an up count operation and a down count operation according to a level of an output voltage of the first voltage comparator; a first D/A converter circuit for outputting a voltage according to the count value of the first up/down counter; a second up/down counter for switching between an up count operation and a down count operation according to a level of output voltage of the second voltage comparator; a second D/A converter circuit for outputting a voltage according to a count value of the second up/down counter; second and third voltage comparators for comparing an output voltage of the first D/A converter circuit with an output voltage of the second D/A converter circuit; and a clock switch circuit for switching a count operation clock frequency of the first up/down counter based on a level of an output voltage of the third voltage comparator. In the AGC circuit, a gain control signal according to the output voltage of the first D/A converter circuit is supplied to the variable gain amplifier circuit.

In one embodiment of the AGC circuit according to the present invention, a first register is provided between the first voltage comparator and the first up/down counter, and the AGC circuit is configured for storing the output voltage of the first voltage comparator in the first register with a cycle of a first reference clock, switching an operation of the first up/down counter between the up count operation and the down count operation according to a level of the voltage stored in the first register, and not transmitting a change in the output voltage of the first voltage comparator in a shorter period than the cycle of the first reference clock to the first up/down counter.

In another embodiment of the AGC circuit according to the present invention, a second register is provided between the second voltage comparator and the second up/down counter, and the AGC circuit is configured for storing the output voltage of the second voltage comparator in the second register with a cycle of a second reference clock, switching an operation of the second up/down counter between the up count operation and the down count operation according to a level of the voltage stored in the second register, and not transmitting a change in the output voltage of the second voltage comparator in a shorter period than the cycle of the second reference clock to the second up/down counter.

In another embodiment of the AGC circuit according to the present invention, a third register is provided between the third voltage comparator and the clock switch circuit, and the AGC circuit is configured for storing the output voltage of the third voltage comparator in the third register with a cycle of a third reference clock, controlling an operation of the clock switch circuit according to a level of the voltage stored in the third register, and not transmitting a change in an output voltage of the third voltage comparator in a shorter period than the cycle of the third reference clock to the clock switch circuit.

In another embodiment of the AGC circuit according to the present invention, a first count operation control circuit is provided between the first voltage comparator and the first up/down counter, according to the count value of the first up/down counter, the AGC circuit transmits the output voltage of the first voltage comparator to the first up/down counter or cuts off a transmission of the output voltage, thereby limiting the count value of the first up/down counter to within a range from a predetermined first upper limit value to a predetermined first lower limit value, a second count operation control circuit is provided between the second voltage comparator and the second up/down counter, and according to the count value of the second up/down counter, the AGC circuit transmits the output voltage of the second voltage comparator to the second up/down counter or cuts off a transmission of the output voltage, thereby limiting the count value of the second up/down counter to within a range from a predetermined second upper limit value to a predetermined second lower limit value.

In another embodiment of the AGC circuit according to the present invention, a first count operation control circuit is provided between the first register and the first up/down counter, according to the count value of the first up/down counter, the AGC circuit transmits the output voltage of the first register to the first up/down counter or cuts off a transmission of the output, thereby limiting the count value of the first up/down counter to within a range from a predetermined first upper limit value and a predetermined first lower limit value, a second count operation circuit is provided between the second register and the second up/down counter, and according to the count value of the second up/down counter, the AGC circuit transmits the output voltage of the second register or cuts off a transmission of the output, thereby limiting the count value of the second up/down counter to within a range from a predetermined second upper limit value to a predetermined second lower limit value.

In another embodiment of the AGC circuit according to the present invention, the first up/down counter has the function of limiting the count value to within a range from a predetermined first upper limit value to a first lower limit value by executing the up count operation or stopping an execution of the up count operation according to the count value while executing a down count operation or stopping an execution of the down count operation according to the count value, and the second up/down counter has the function of limiting the count value to within a range from a predetermined second upper limit value to a second lower limit value by executing the up count operation or stopping an execution of the up count operation according to the count value while executing a down count operation or stopping an execution of the down count operation according to the count value.

An AGC circuit according to the present invention, a variable gain amplifier circuit having a gain controlled by a gain control signal; a rectifier circuit for rectifying an output signal of the variable gain amplifier circuit; a first voltage comparator for comparing a rectified signal rectified by the rectifier circuit with a voltage arbitrarily set beforehand; a first up/down counter for switching between an up count operation and a down count operation according to a level of an output voltage of the first voltage comparator; a first D/A converter circuit for outputting a voltage according to a count value of the first up/down counter; a second up/down counter for switching between an up count operation and a down count operation according to a level of an output voltage of a second voltage comparator; a second D/A converter circuit for outputting a voltage according to a count value of the second up/down counter; second, third and fourth voltage comparators for comparing an output voltage of the first D/A converter circuit with an output voltage of the second D/A converter circuit; and a clock switch circuit for switching a count operation clock frequency of the first up/down counter based on the respective levels of the output voltages of the third and fourth voltage comparators. In the AGC circuit, a gain control signal according to the output voltage output of the first D/A converter circuit is supplied to the variable gain amplifier circuit.

In one embodiment of the AGC circuit according to the present invention, a first register is provided between the first voltage comparator and the first up/down counter, and the AGC circuit is configured for storing the output voltage of the first voltage comparator in the first register with a cycle of a first reference clock, switching an operation of the first up/down counter between the up count operation and the down count operation according to a level of the voltage stored in the first register, and not transmitting a change in the output voltage of the first voltage comparator in a shorter period than the cycle of the first reference clock to the first up/down counter.

In another embodiment of the AGC circuit according to the present invention, a second register is provided between the second voltage comparator and the second up/down counter, and the AGC circuit is configured for storing the output voltage of the second voltage comparator in the second register with a cycle of a second reference clock, switching an operation of the second up/down counter between the up count operation and the down count operation according to a level of the voltage stored in the second register, and not transmitting a change in the output voltage of the second voltage comparator in a shorter period than the cycle of the second reference clock is transmitted to the second up/down counter.

In another embodiment of the AGC circuit according to the present invention, third and fourth registers are provided between the third voltage comparator and the clock switch circuit and between the fourth voltage comparator and the clock switch circuit, respectively, and the AGC circuit is configured for storing the output voltage of the third voltage comparator in the third resistor with a cycle of a third reference clock and the output voltage of the fourth voltage comparator in the fourth register with a cycle of a fourth reference clock, controlling the operation of the clock switch circuit according to respective levels of the voltages stored in the third and fourth resistors, and not transmitting a change in the output voltage of the third voltage comparator in a shorter period than the cycle of the third reference clock and in the output voltage of the fourth voltage comparator in a shorter period than the cycle of the fourth reference clock to the clock switch circuit.

In another embodiment of the AGC circuit according to the present invention, a first count operation control circuit is provided between the first voltage comparator and the first up/down counter, according to the count value of the first up/down counter, the AGC circuit transmits the output voltage of the first voltage comparator to the first up/down counter or cuts off a transmission of the output voltage, thereby limiting the count value of the first up/down counter to within a range from a predetermined first upper limit value to a predetermined first lower limit value, a second count operation control circuit is provided between the second voltage comparator and the second up/down counter, and according to the count value of the second up/down counter, the AGC circuit transmits the output voltage of the second voltage comparator to the second up/down counter or cuts off a transmission of the output voltage, thereby limiting the count value of the second up/down counter to within a range from a predetermined second upper limit value to a predetermined second lower limit value.

In another embodiment of the AGC circuit according to the present invention, a first count operation control circuit is provided between the first register and the first up/down counter, according to the count value of the first up/down counter, the AGC circuit transmits the output voltage of the first register to the first up/down counter or cuts off a transmission of the output, thereby limiting the count value of the first up/down counter to within a range from a predetermined first upper limit value and a predetermined first lower limit value, a second count operation circuit is provided between the second register and the second up/down counter, and according to the count value of the second up/down counter, the AGC circuit transmits the output voltage of the second register or cuts off a transmission of the output, thereby limiting the count value of the second up/down counter to within a range from a predetermined second upper limit value to a predetermined second lower limit value.

In another embodiment of the AGC circuit according to the present invention, the first up/down counter has the function of limiting the count value to within a range from a predetermined first upper limit value to a first lower limit value by executing the up count operation or stopping an execution of the up count operation according to the count value while executing a down count operation or stopping an execution of the down count operation according to the count value, and the second up/down counter has the function of limiting the count value to within a range from a predetermined second upper limit value to a second lower limit value by executing the up count operation or stopping an execution of the up count operation according to the count value while executing a down count operation or stopping an execution of the down count operation according to the count value.

As has been described, according to the present invention, the frequency of a clock signal to be input to the first up/down counter is changed, so that an input signal to the gain control circuit is generated by only an output of the first up/down counter. Therefore, highly accurate control can be performed without switching of the input signal and inputting of a signal including noise and the like generated due to the switch circuit itself directly into the gain control circuit.

Moreover, according to the present invention, an output voltage output from the first voltage comparator is stored with a cycle which has been set beforehand and the stored output voltage is used as a control signal for the first up/down counter. Thus, highly accurate control can be performed without being influenced by an abnormal signal generated with a shorter cycle than the cycle which has been set beforehand and stored.

Furthermore, according to the present invention, an output voltage output from the second voltage comparator is stored with a cycle which has been set beforehand and the stored output voltage is used as a control signal for the second up/down counter and the clock switch circuit. Therefore, highly accurate control can be performed without being influenced by an abnormal signal generated with a shorter cycle than the cycle which has been set beforehand and stored.

Subsequently, according to the present invention, a predetermined upper value and a predetermined lower value are set for each of the first and second up/down counters. Thus, overflow of the up/down counters can be prevented and the gain variation width of the variable gain amplifier circuit can be arbitrarily set.

Moreover, according to the present invention, with separate voltage comparators provided, a signal for controlling the second up/down counter and a signal for controlling the clock switch circuit can be independently generated.

Furthermore, according to the present invention, an output voltage output from the first voltage comparator is stored with a cycle which has been set beforehand and the stored output voltage is used as a control signal for the first up/down counter. Thus, highly accurate control can be performed without being influenced by an abnormal signal generated with a shorter cycle than the cycle which has been set beforehand and stored.

Subsequently, according to the present invention, an output voltage output from the second voltage comparator is stored with a cycle which has been set beforehand and the stored output voltage is used as a control signal for the second up/down counter. Thus, highly accurate control can be performed without being influenced by an abnormal signal generated with a shorter cycle than the cycle which has been set beforehand and stored.

Moreover, according to the present invention, an output voltage output from the third voltage comparator is stored with a cycle which has been set beforehand and the stored output voltage is used as a control signal for the clock switch circuit. Thus, highly accurate control can be performed without being influenced by an abnormal signal generated with a shorter cycle than the cycle which has been set beforehand and stored.

Furthermore, according to the present invention, the first and second count operation control circuits for monitoring so that a count value does not exceed an upper limit value or go below a lower limit value are provided in the first and second up/down counters, respectively. Then, when an output value of the up/down counter reaches a predetermined upper limit value, a control signal at a high level is cut off so that a down count operation is started to reduce the count value, and when the output value reaches a predetermined lower limit value, a control signal at a low level is cut off so that an up count operation is started to increase the count value. Thus, overflow of each of the first and second up/down counters can be prevented.

Subsequently, according to the present invention, with three separate voltage comparators provided, two signals of which one is for controlling the second up/down counter and the other is for controlling the clock switch circuit can be independently generated.

Moreover, according to the present invention, an output voltage output from the first voltage comparator is stored with a cycle which has been set beforehand and the stored output voltage is used as a control signal for the first up/down counter. Thus, highly accurate control can be performed without being influenced by an abnormal signal generated with a shorter cycle than the cycle which has been set beforehand and stored.

Furthermore, according to the present invention, an output voltage output from the second voltage comparator is stored with a cycle which has been set beforehand and the stored output voltage is used as a control signal for the second up/down counter. Thus, highly accurate control can be performed without being influenced by an abnormal signal generated with a shorter cycle than the cycle which has been set and stored.

Subsequently, according to the present invention, each of output voltages output from the third and fourth voltage comparators, respectively, is stored with a cycle which has been set beforehand and each of the stored output voltages is used as a control signal for the clock switch circuit. Thus, highly accurate control can be performed without being influenced by an abnormal signal generated with a shorter cycle than the cycle which has been set and stored.

Moreover, according to the present invention, the first and second count operation control circuits for monitoring so that a count value does not exceed an upper limit value or go below a lower limit value are provided in the first and second up/down counters, respectively. Then, when an output value of the up/down counter reaches a predetermined upper limit value, a control signal at a high level is cut off so that a down count operation is started to reduce the count value, and when the output value reaches a predetermined lower limit value, a control signal at a low level is cut off so that an up count operation is started to increase the count value. Thus, overflow of each of the first and second up/down counters can be prevented.

BRIEF DESCRIPTION OF THE DRAWINGS

FIGS. 2A through 2H are waveform charts describing the operation of the AGC circuit of FIG. 1.

FIGS. 16A through 16G are waveform charts describing the operation of the AGC circuit of FIG. 15 and its comparison with the AGC circuit of FIG. 1.

FIGS. 24A through 24I are waveforms describing the operation of the AGC circuit relating to the present invention.

DESCRIPTION OF THE PREFERRED EMBODIMENTS

Hereinafter, embodiments of the present invention will be described with reference to the accompanying drawings.

Figure 1:
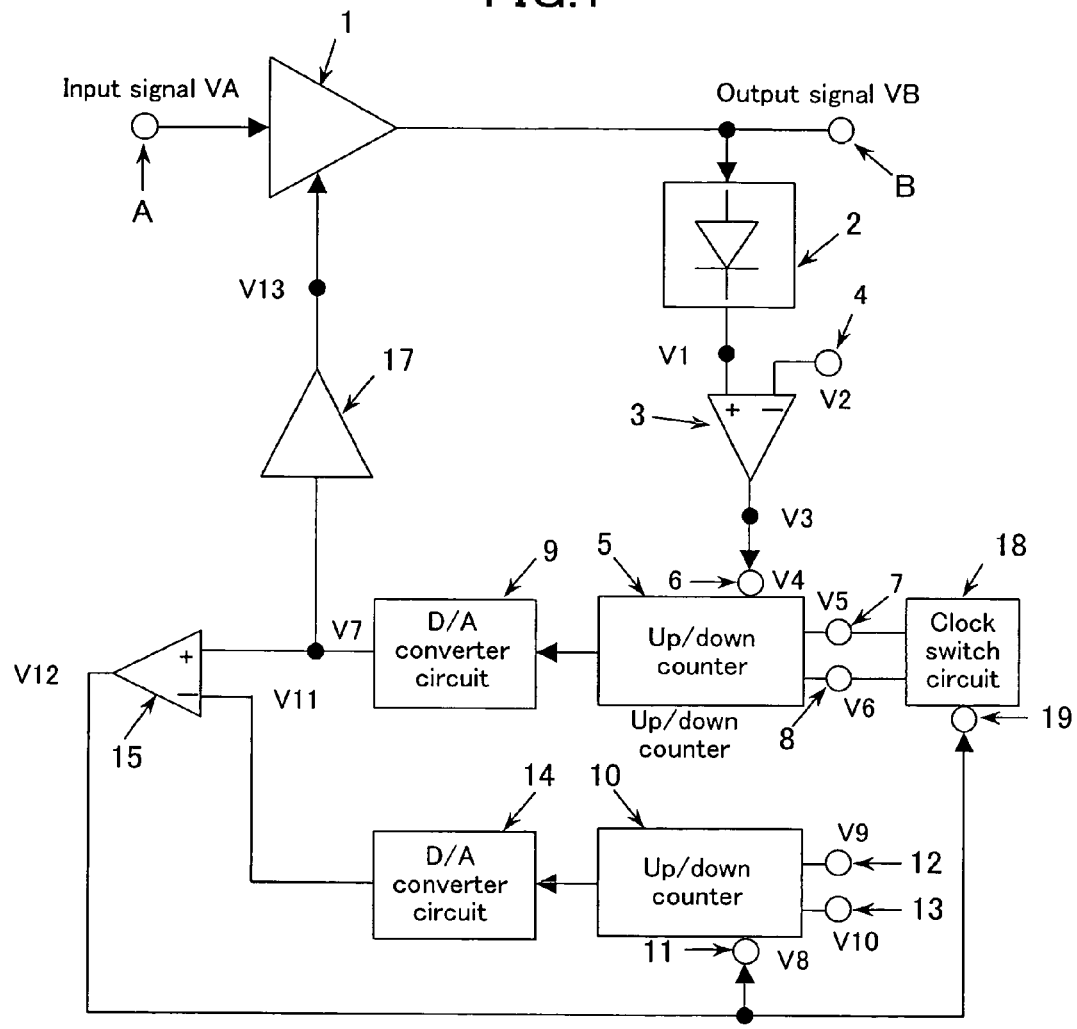
FIG. 1 is a block diagram illustrating a first embodiment of an AGC circuit according to the present invention.

FIG. 1 is a block diagram illustrating an embodiment of an AGC circuit according to the present invention. In FIG. 1, A denotes a signal input terminal to which an input signal VA is supplied. The reference numeral 1 is a variable gain amplifier circuit for amplifying or diminishing a voltage of the input signal VA according to a gain controlled by the gain control voltage V13 and outputting an output signal VB. B denotes an output terminal of the variable gain amplifier circuit 1. The reference numeral 2 denotes a rectifier circuit for rectifying an output voltage of the variable gain amplifier circuit 1. Hereinafter, the rectifier circuit 2 will be described as a full-wave rectifier circuit. However, the rectifier circuit may be a half-wave rectifier circuit. The reference numeral 3 denotes a first voltage comparator for comparing a rectified signal (output signal) V1 rectified by the rectifier circuit 2 with an arbitrary threshold voltage which has been set beforehand and outputting a voltage V3 at a high level when the output signal V1 is higher than the threshold voltage V2 and the voltage V3 at a low level when the output signal V1 is lower than the threshold voltage V2. The reference numeral 4 denotes a threshold voltage input terminal for inputting the threshold voltage V2 to the first voltage comparator 3. The reference numeral 5 is a first up/down counter. The reference numeral 6 denotes an up/down operation control input terminal for receiving the output voltage V3 of the first voltage comparator 3 as a control signal V4 and controlling an up/down operation. The reference numeral 7 denotes an input terminal for receiving an up count operation clock V5. The reference numeral 8 denotes an input terminal for receiving a down count operation clock V6. The reference numeral 9 denotes a first D/A conversion circuit for outputting a direct current voltage V7 according to a count value C of the first up/down counter 5. The reference numeral 10 denotes a second up/down counter. The reference numeral 11 denotes an up/down operation control input terminal for receiving a control signal V8 to control the counting direction of the second up/down counter 10. The reference numeral 12 denotes an up count operation clock input terminal for inputting an up count operation clock V9 to the second up/down counter 10. The reference numeral 13 denotes a down count operation clock input terminal for inputting a down count operation clock V10 to the second up/down counter 10. The reference numeral 14 denotes a second D/A converter circuit for outputting a direct current voltage V11 according to a count value D of the second up/down counter 10. The reference numeral 15 denotes a second voltage comparator for comparing an output voltage V7 of the first D/A converter circuit 9 with an output voltage V11 of the second D/A converter circuit 14. The second voltage comparator 15 outputs a voltage V12 at the high or low level according to a result obtained from the comparison between the voltages V7 and V11 and controls an up/down operation of the second up/down counter 10. The reference numeral 18 denotes a clock switch circuit for receiving the voltage V12 as an input and switching the respective frequencies of the count operation clocks V5 and V6 of the first up/down counter 5 according to the level of the voltage V12. The reference numeral 19 denotes a first clock switch control input terminal of the clock switch circuit 18. The reference numeral 17 denotes a direct current amplifier circuit for receiving, with a gain arbitrarily set, an output direct current voltage V7 of the first D/A converter circuit 9 as an input signal and outputting a gain control voltage V13.

Note that in FIG. 1, the rectifier circuit 2, the voltage comparator 3, the up/down counter 5, the D/A converter circuit 9, the direct current amplifier circuit 17, the up/down counter 10, the D/A converter circuit 14, the voltage comparator 15 and the clock switch circuit 18 together constitute an analog signal detector circuit for detecting the analog signal level of the output signal VB of the gain control amplifier circuit 1. In this embodiment, the AGC circuit is configured so that a gain of the gain control amplifier circuit 1 is controlled according to an output signal of the analog signal level detector circuit. However, the analog signal level detector circuit is not limited to application to an AGC circuit, but various other applications of the analog signal level detector circuit are possible.

Note that in the above-described configuration, when a half-wave rectifier circuit is used, instead of the full-wave rectifier circuit, basically, the full-wave rectifier can be merely replaced with a half-wave rectifier circuit. However, to let the half-wave rectifier circuit have the same response property, the threshold of the voltage comparator and the clock frequency of the up/down counter have to be adjusted.

Hereinafter, the operation of the embodiment of the AGC circuit of the present invention, formed to have the above-described configuration, will be described with reference to FIGS. 2A through 2H.

The input signal VA is amplified or diminished by the variable gain amplifier circuit 1 to be the output signal VB. The output signal VB is rectified by the rectifier circuit 2 to be the output signal V1 having a waveform shown in FIG. 2A. In FIG. 2A, the output signal V1 is lower than the threshold voltage V2 in periods T1 and T3 and higher than the threshold voltage V2 in periods T2 and T4.

Next, the output signal V1 of the rectifier circuit 2 is received by the voltage comparator 3. The voltage comparator 3 compares the output signal V1 of the rectifier circuit 2 to the threshold voltage V2 and, as shown in the waveform of FIG. 2B, outputs as the output signal V3 a high level voltage in the periods T2 and T4 in which the output signal V1 is higher than the threshold voltage V2 and a low level voltage in the periods T1 and T3 in which the output signal V1 is lower than the threshold voltage V2.

The output signal V3 is received by the up/down operation control input terminal 6 of the up/down counter 5 in the subsequent stage to be the control signal V4 for controlling up and down count operations of the up/down counter 5.

The up/down counter 5 performs an up count operation according to an up count frequency set by the up count operation clock V5 having a waveform shown in FIG. 2C in a period in which the control signal (voltage) V4 is the high level. Moreover, in a period in which the control signal (voltage) V4 is the low level, a down count operation is performed according to a down count frequency set by the down count operation clock V6 having a waveform shown in FIG. 2D. With this waveform, the frequency of the down count operation clock is switched by a clock switch circuit, which will be later described, depending on the polarity of the voltage comparator 15.

The count value C counted by the up/down counter 5 is received by the D/A converter circuit 9. The D/A converter circuit 9 outputs the direct current voltage V7 according to the count value C of the up/down counter 5.

On the other hand, the up/down counter 10 performs an up count operation according to the up count frequency having a waveform of FIG. 2E and set by the up count operation clock V9 in a period in which the control signal (voltage) V8 to be received by the up/down operation control input terminal 11, i.e., the output voltage V12 of the second voltage comparator 15 is the high level and performs a down count operation according to the down count frequency having the waveform of FIG. 2F and set by the down count operation clock V10 in a period in which the output signal (voltage) V12 is the low level.

The count value D counted by the up/down counter 10 is received by the D/A converter circuit 14. The D/A converter circuit 14 outputs the direct current voltage V11 according to the count value D and having a waveform of FIG. 2G. In this case, an up count operation is performed with the direct current voltage V11 in the period T5 in which the direct current voltage V7 is higher than the direct current voltage V11 and a down count operation is performed with the direct count voltage V11 in the period T6 in which the direct current voltage V7 is lower than the direct current voltage V11.

Moreover, the direct current voltages V7 and V11 are compared with each other by the voltage comparator 15. The waveform of FIG. 2H shows change in the output signal V12 of the voltage comparator 15. In FIG. 2H, high level part indicates the case where the direct current voltage V7 is higher than the direct current voltage V11 and low level part indicates the case where the direct current voltage V7 is lower than the direct current voltage V11. The output signal V12 serves as the control signal V8 for controlling an up/down operation of the up/down counter 10.

Furthermore, the control signal V8 is received by the clock switch control input terminal 19 of the clock switch circuit 18 and switches the count operation clock of the up/down counter 10 according to the polarity of the control signal V8. In this embodiment, when the control signal V8 is switched from High to Low, the down count operation clock of the up/down counter 10 is switched from a high frequency V6-1 to a low frequency V6-2.

The direct voltage V7 is amplified to an arbitrary size by the direct amplifier circuit 17 to be the gain control voltage V13 of the variable gain amplifier circuit 1. The gain of the variable gain amplifier circuit 1 is changed by the gain control voltage V13 and the input signal VA is amplified or diminished. In this embodiment, as a count value becomes larger, the gain control voltage V13 is increased and the gain of the variable gain amplifier circuit 1 is reduced. As a count value becomes smaller, the gain control voltage V13 is reduced and the gain of the variable gain amplifier circuit 1 is increased. Then, the gain of the variable gain amplifier circuit 1 is changed by the gain control voltage V13 and the input signal VA is amplified or diminished. The above-described operation is repeated until a time when amplification and diminishment of the input signal VA by the up/down counter or the up/down counter balance out each other and the output voltage VB converges to a certain amplitude level.

Figure 22:
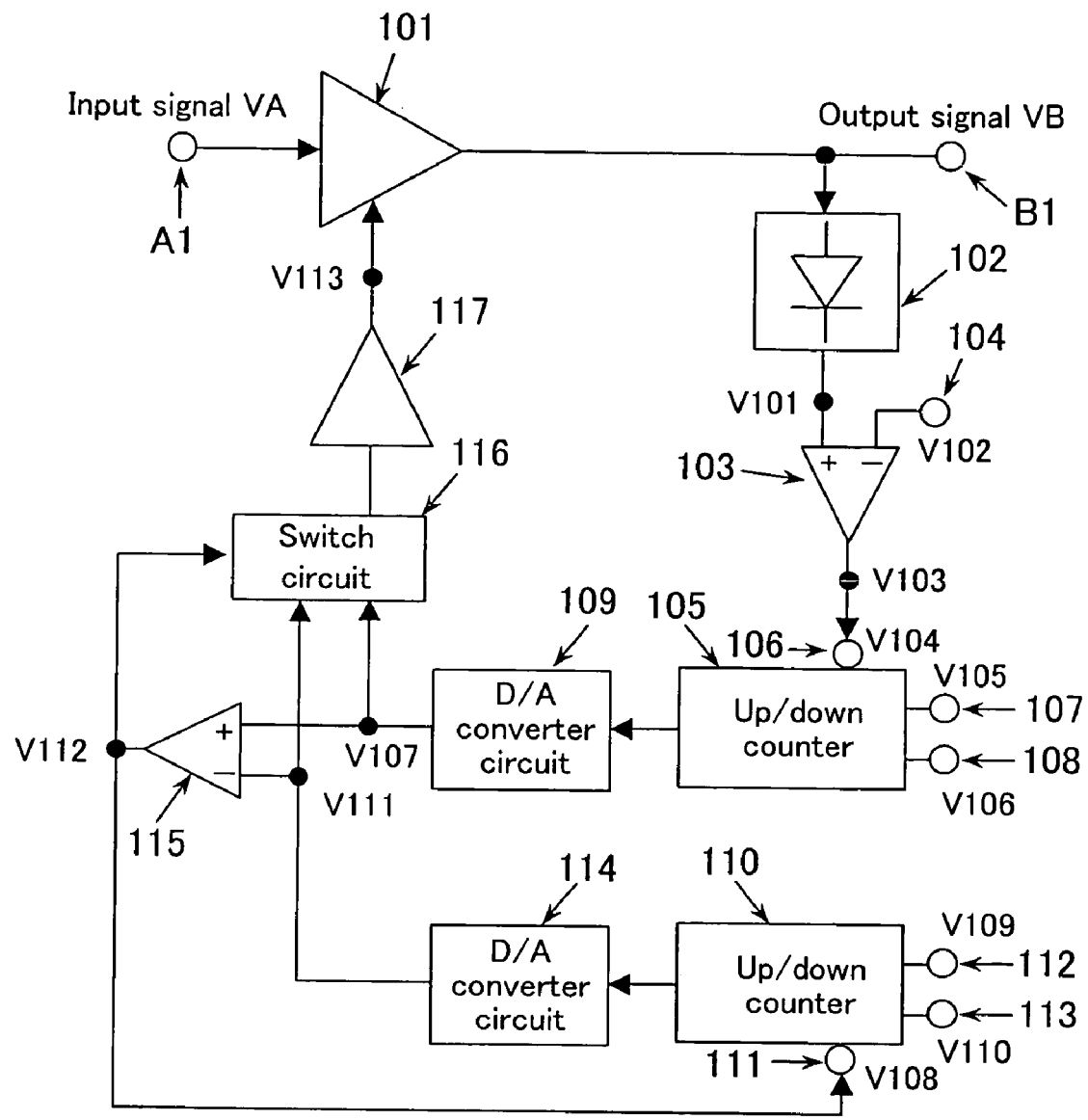
FIG. 22 is a block diagram illustrating the configuration of the AGC circuit of the present invention.
Figure 23A:
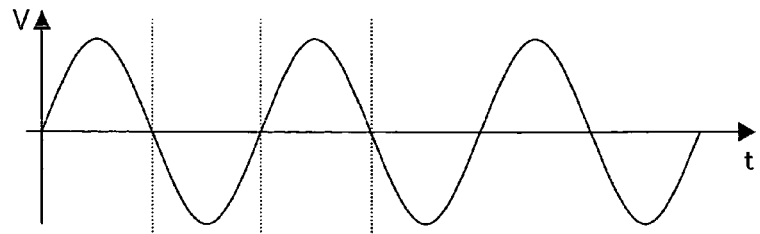
FIGS. 23A through 23F are waveforms describing the operation of the AGC circuit relating to the present invention.
Figure 23B:
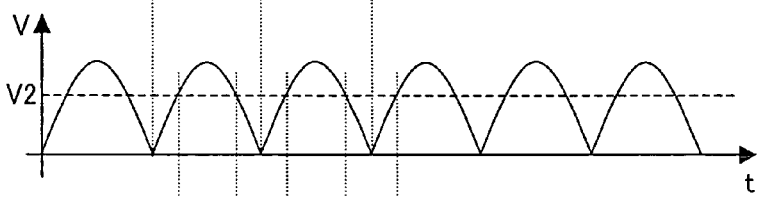
Figure 23C:
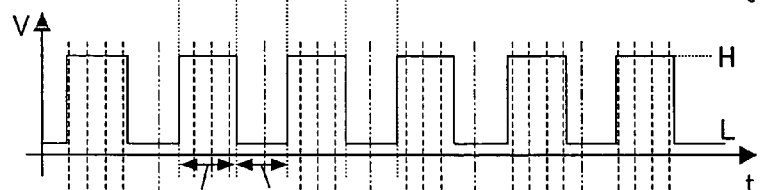
Figure 23D:
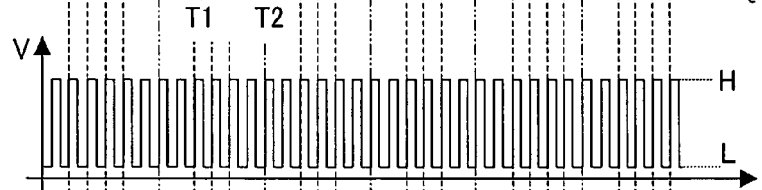
Figure 23E:
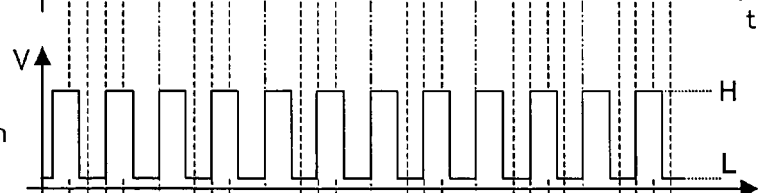
Figure 23F:

With the configuration of FIG. 22, for example, when the AGC circuit is used for speech signal processing, a following count operation clock frequency of the gain control signal V113 is changed depending on the types of sounds continuously input, so that a speech signal without discomfort can be output. As an example of such cases, where the frequency of V105> the frequency of 109 and the frequency of V106> the frequency of V110 holds, an attack time follows up the frequency of V105, a recovery time is followed the frequency of V110, and a sound is stabilized with a constant amplitude. In such a state, if a recovery operation when an abrupt and big sound in a short time such as a crack is input made to follow up V106, a speech signal which does not have discomfort and does not damage sound presence and perspective can be output. With the configuration of the embodiment of FIG. 1 according to the present invention, in a state where V5=V105, V9=V109 and V10=V110 hold, when the frequency of V6 is made to be V106 at a high frequency (V6-1) and V110 at a low frequency (V6-2), a speech signal without discomfort can be output as in the AGC circuit of FIG. 22.

With the configuration of the embodiment of FIG. 1 according to the present invention, unlike the example of FIG. 22, the gain control signal V13 is made up of only an output of the D/A converter circuit, so that the switch circuit is no longer necessary. Thus, an AGC circuit which allows suppression of change in the gain control signal V13 due to switching of the source of the gain control signal, which causes distortion of the output waveform of the variable gain control circuit 1 or the generation of a frequency signal not originally input, and distortion of the output waveform or the generation of an abnormal signal due to switching noise of the switch circuit itself, and also maintenance of the effects of a known AGC circuit can be provided.

In the above description, the output voltage V7 of the D/A conversion circuit 9 is received by the direct current amplifier circuit 17 and the output voltage of the direct current amplifier circuit 17 is used as the gain control voltage V13. However, it is clear that if the output voltage V7 of the D/A conversion circuit 9 is directly used as a direct current control signal, the AGC circuit of the present invention can be achieved.

Moreover, in the above description, it is assumed that the gain of the variable gain amplifier circuit 1 is controlled by the voltage system. However, by changing the forms or the combination of the respective outputs of the D/A converter circuit 9 and the direct current amplifier circuit 17 with a gain control system (i.e., a current type or voltage type gain control system) of the variable gain amplifier circuit 1, the AGC circuit of the present invention can be achieved. Therefore, a "gain control signal" means to be not only a gain control voltage but also a gain control signal.

The following points are applied to embodiments which will be later described.

Figure 3:
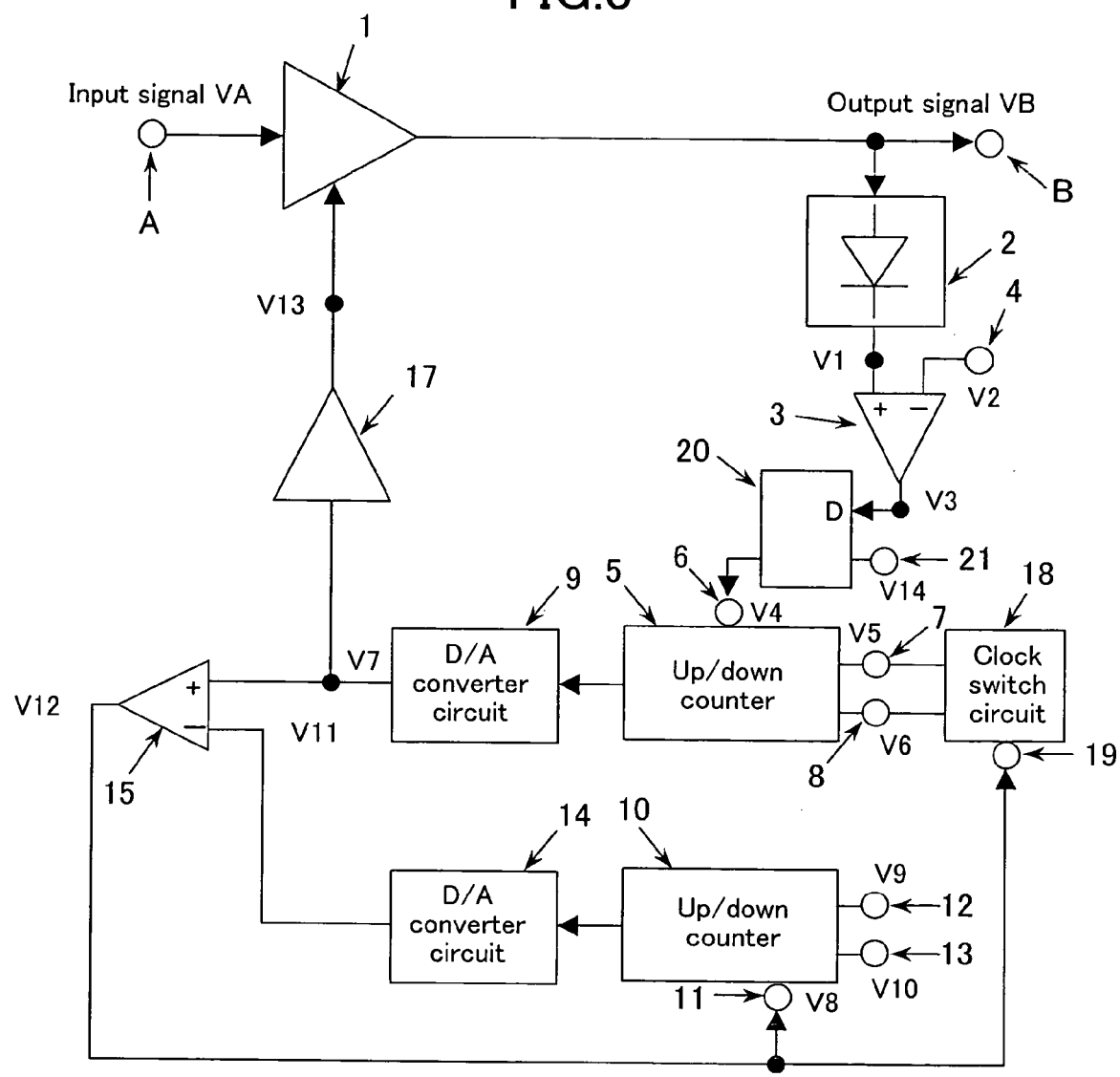
FIG. 3 a block diagram illustrating a second embodiment of the AGC circuit of the present invention.

FIG. 3 is a block diagram illustrating an embodiment of an AGC circuit according to the present invention. In FIG. 3, each member of the embodiment using the AGC circuit of FIG. 1 according to the present invention is identified by the same reference numeral and therefore description thereof will be omitted. Only each member newly added to the AGC circuit of FIG. 1 will be described. The reference numeral 20 denotes a flipflop as a resistor for storing the polarity of the signal V3 output by the first voltage comparator 3, i.e., a voltage level (high or low level) with the clock cycle of the reference clock V14 and transmitting the stored polarity with the clock cycle of the reference clock V14 to the up/down operation control input terminal 6 of the first up/down counter 5. The reference numeral 21 denotes a reference clock input terminal of the flipflop 20.

This embodiment is characterized in that even if the output of the voltage comparator 3 is change within a shorter time than the cycle of the reference clock V9 due to chattering or exogenous noise, the count operation which the up/down counter 5 originally performs is not influenced. Accordingly, the count operation of the up/down counter 5 is stabilized and the operation of the variable gain amplifier circuit 1 is stabilized. Therefore, an even more excellent AGC circuit can be provided.

Figure 4:
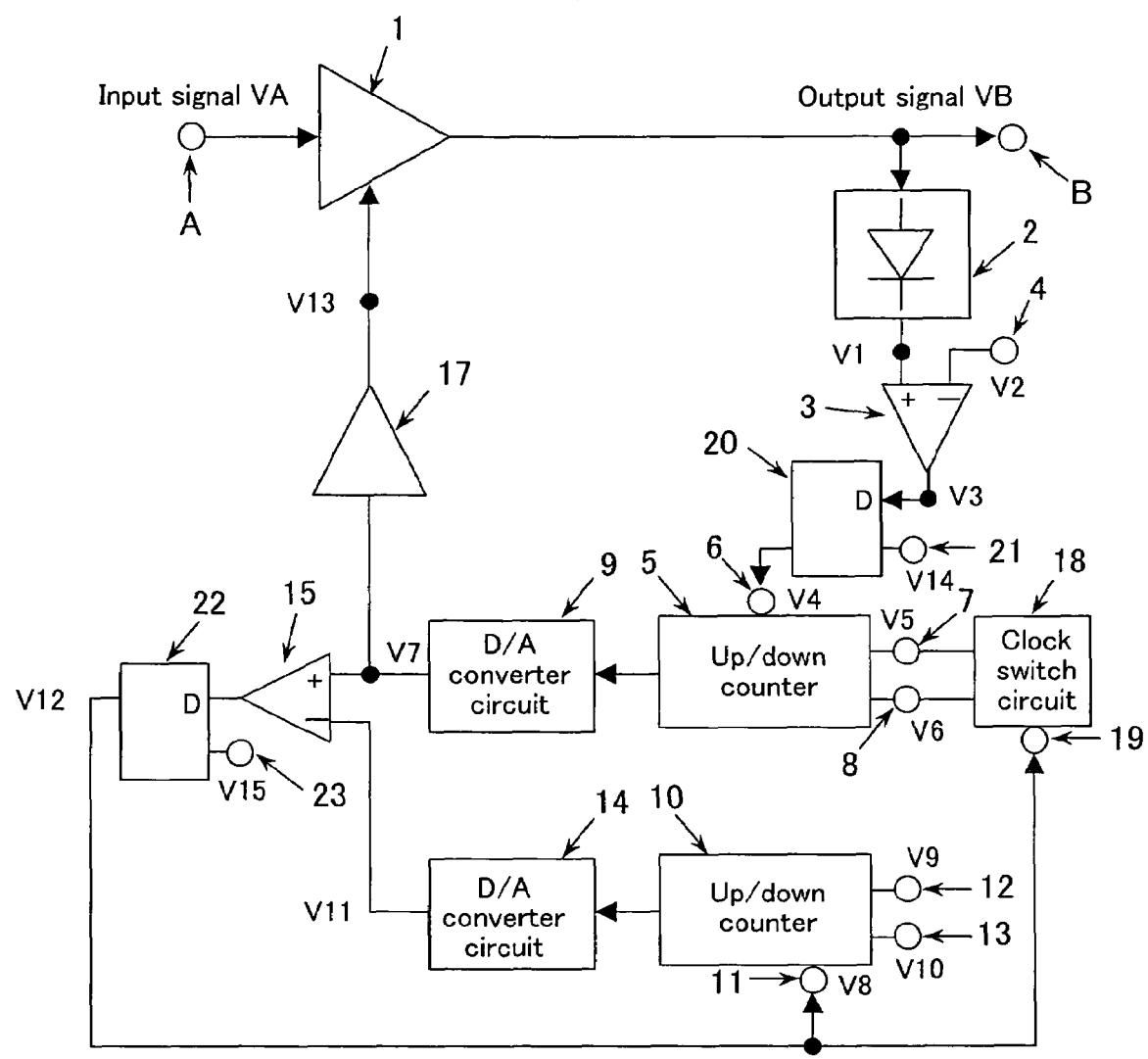
FIG. 4 is a block diagram illustrating a third embodiment of the AGC circuit of the present invention.

FIG. 4 is a block diagram illustrating a configuration obtained by adding a register 22 so that an influence of change in the output of the voltage comparator 15 is not transmitted to the up/down counter 10 and the clock switch circuit 18 as in the embodiment of FIG. 3.

Figure 5:
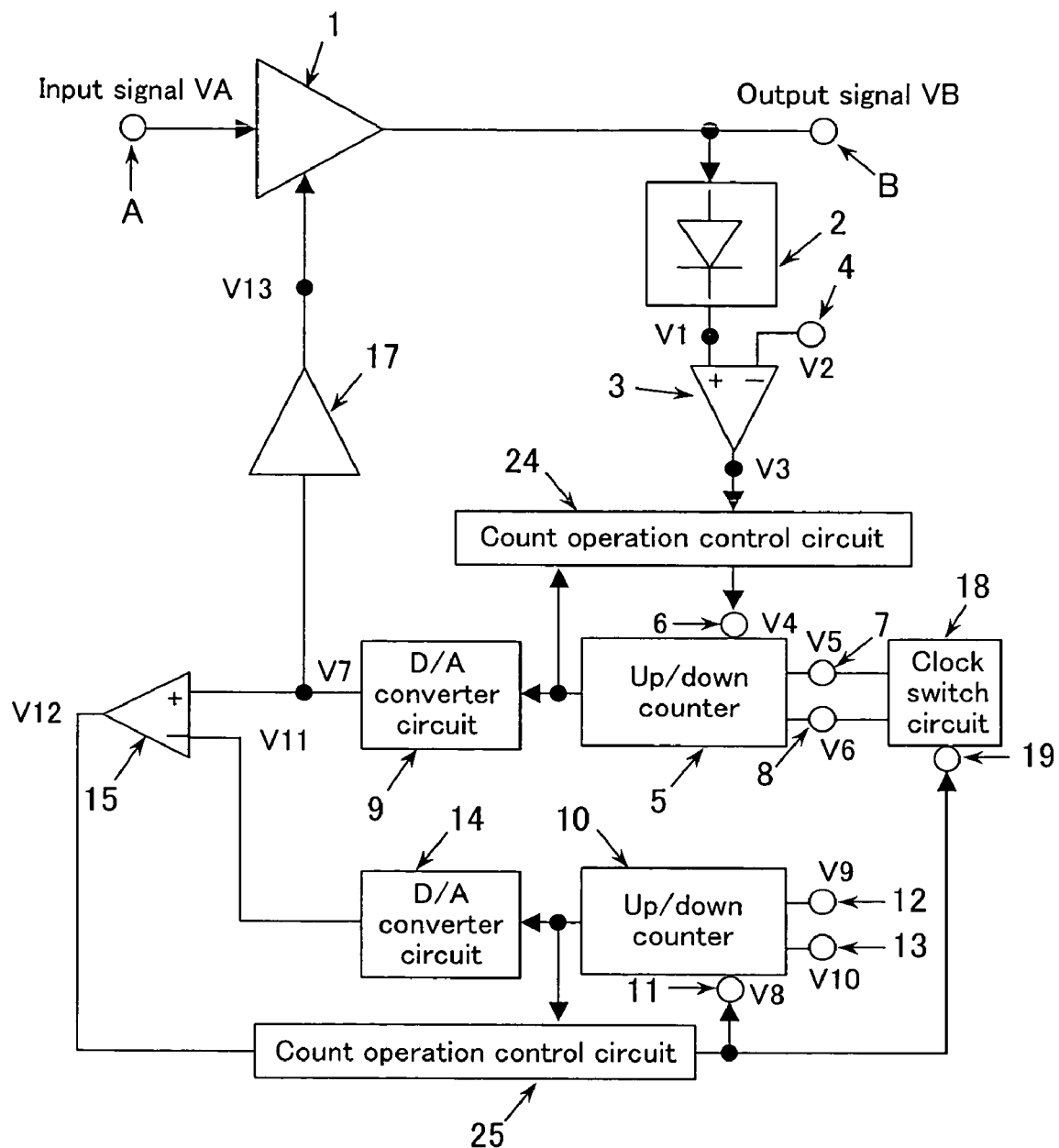
FIG. 5 is a block diagram illustrating a fourth embodiment of the AGC circuit of the present invention.

FIG. 5 is a block diagram illustrating an embodiment using an AGC circuit according to the present invention. In FIG. 5, each member of the embodiment using the AGC circuit of FIG. 1 according to the present invention is identified by the same reference numeral and therefore description thereof will be omitted. Only each member newly added to the AGC circuit of FIG. 1 will be described. The reference numeral 24 denotes a first count operation control circuit for performing, according to the count value C counted by the first up/down counter 5, control to determine which transmission of the voltage V3 at the high or low level output by the first voltage comparator 3 to the up/down operation control input terminal 6 and cutting off of transmission of the voltage V3 at the high or low level is performed. The reference numeral 25 denotes a second count operation control circuit for performing, according to the count value D counted by the second up/down counter 10, control to determine which transmission of the voltage V12 at the high or low level output by the second voltage comparator 15 to the up/down operation control input terminal 11 and the clock switch control input terminal 19 and cutting off of transmission of the voltage V12 at the high or low level is performed.

Specifically, when the count value C is smaller than a predetermined upper limit value, the first count operation control circuit 24 transmits the voltage V3 at the high level to the up/down operation control input terminal 6. However, when the count value C has reached to the predetermined upper limit value, the first count operation control circuit 24 cuts off the voltage V3 at the high level so as not to transmit the voltage V3 to the up/down operation control input terminal 6. Thus, the up/down count operation of the up/down counter 5 is stopped. Note that even if the count value C has reached the predetermined upper limit value, the voltage V3 at the low level is transmitted. This is for making the up/down counter 5 perform a down count operation to reduce the count value C from the predetermined upper limit value.

Moreover, when the count value C is larger than a predetermined lower limit value, the first count operation control circuit 24 transmits the voltage V3 at the low level to the up/down operation control input terminal 6. When the count value C has reached the predetermined lower limit value, the first count operation control circuit 24 cuts off the voltage V3 at the low level so as not to transmit the voltage V3 to the up/down operation control input terminal 6. Thus, the down count operation of the up/down counter 5 is stopped. Note that even if the count value C has reached the predetermined lower limit value, the voltage V3 at the high level is transmitted. This is for making the up/down counter 5 perform an up count operation to increase the count value C from the predetermined lower limit value.

By the above-described operation of the first count operation control circuit 24, the operation of the up/down counter 5 is limited so that the count value C is a value within the range from a predetermined lower limit value and a predetermined upper limit value (including the lower limit value and the upper limit value). Note that the predetermined upper limit value is set to be a maximum count value of the up/down counter 5 or an arbitrary smaller value than the maximum count value. Moreover, the predetermined lower limit value is set to be a minimum count value (e.g., 0) or an arbitrary larger value than the minimum count value. As a matter of course, the upper limit value is larger than the lower limit value. The second count operation control circuit 25 is for limiting the count value D of the up/down counter 10 to a value within the range from the predetermined lower limit value to the predetermined upper limit value (including the lower limit value and the upper limit value).

If no circuit for stopping the count operation of the up/down counter 5 is provided, the following influence occurs. Specifically, assume that a count operation is performed according to the input signal VA and the count C has reached the maximum count value or the minimum count value determined according to the configuration of the up/down counter 5. When counting in the same direction is further performed, the maximum count value is changed to the minimum count value and the minimum count value is changed to the maximum count value. As a result, the gain control voltage V13 is rapidly changed and the output of the variable gain amplifier circuit 1 follows up the change and is rapidly changed. Moreover, assume that no circuit for stopping the count operation of the up/down counter 10 is provided. When the count value D has reached the maximum count value or the minimum count value and a counting operation in the same direction is further performed in the same manner as described above, the maximum count value is changed to the minimum count value and the minimum count value is changed to the maximum count value and then the polarity of the output of the voltage comparator 15 is reversed. As a result, the count operation clock frequency of the up/down counter 5 is switched at some other time than a time at which the switching is intended to be performed, so that auditory influences such as the generation of distortion in the output waveform and the like are caused.

This embodiment is characterized in that with the upper limit value and the lower limit value arbitrarily determined for each of the count value C and the count value D, if the count value C or the count value D has reached the upper limit value, an up count operation is stopped, and if the count value C or the count value D has reached the lower limit value, a down count operation is stopped. In this manner, according to this embodiment, an even more excellent AGC circuit which allows solving the above-described problems can be provided.

A configuration obtained by adding the flipflops 20 and 22 to the configuration of the embodiment of FIG. 5 can be given as an embodiment of the present invention.

Figure 6:
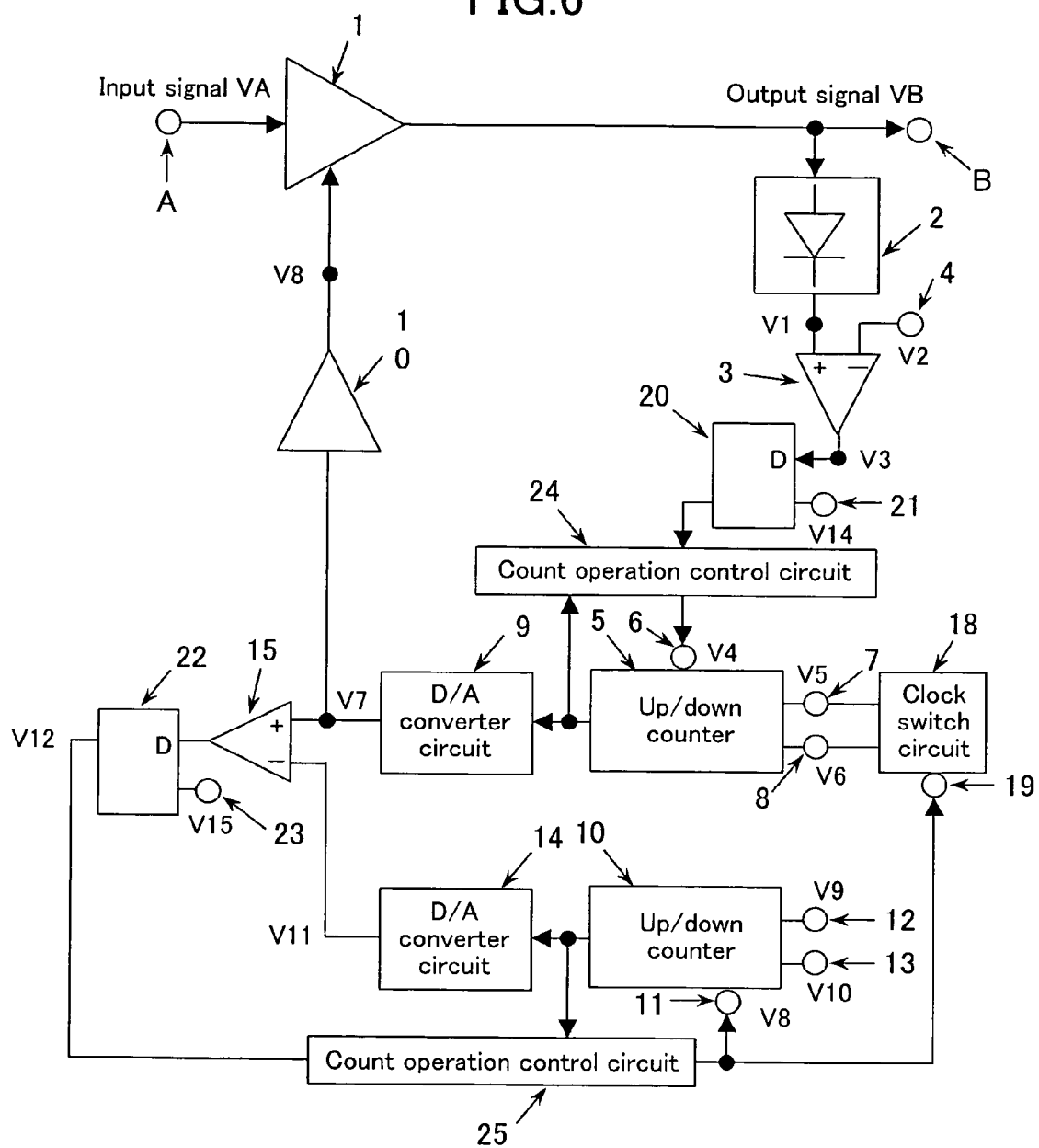
FIG. 6 is a block diagram illustrating a fifth embodiment of the AGC circuit of the present invention.

Note that in each of the embodiments of FIGS. 5 and 6, the count operation control circuits 24 and 25 are provided separately from the up/down counters 5 and 10. However, a function corresponding to a count operation control circuit may be built in an up/down counter. Specifically, the function of limiting a count value to the range between a predetermined upper limit value and a predetermined lower limit value by executing an up count operation or stopping the execution of an up count operation according to a count value while executing a down count operation or stopping the execution of a down count may be built in an up/down counter.

Figure 7:
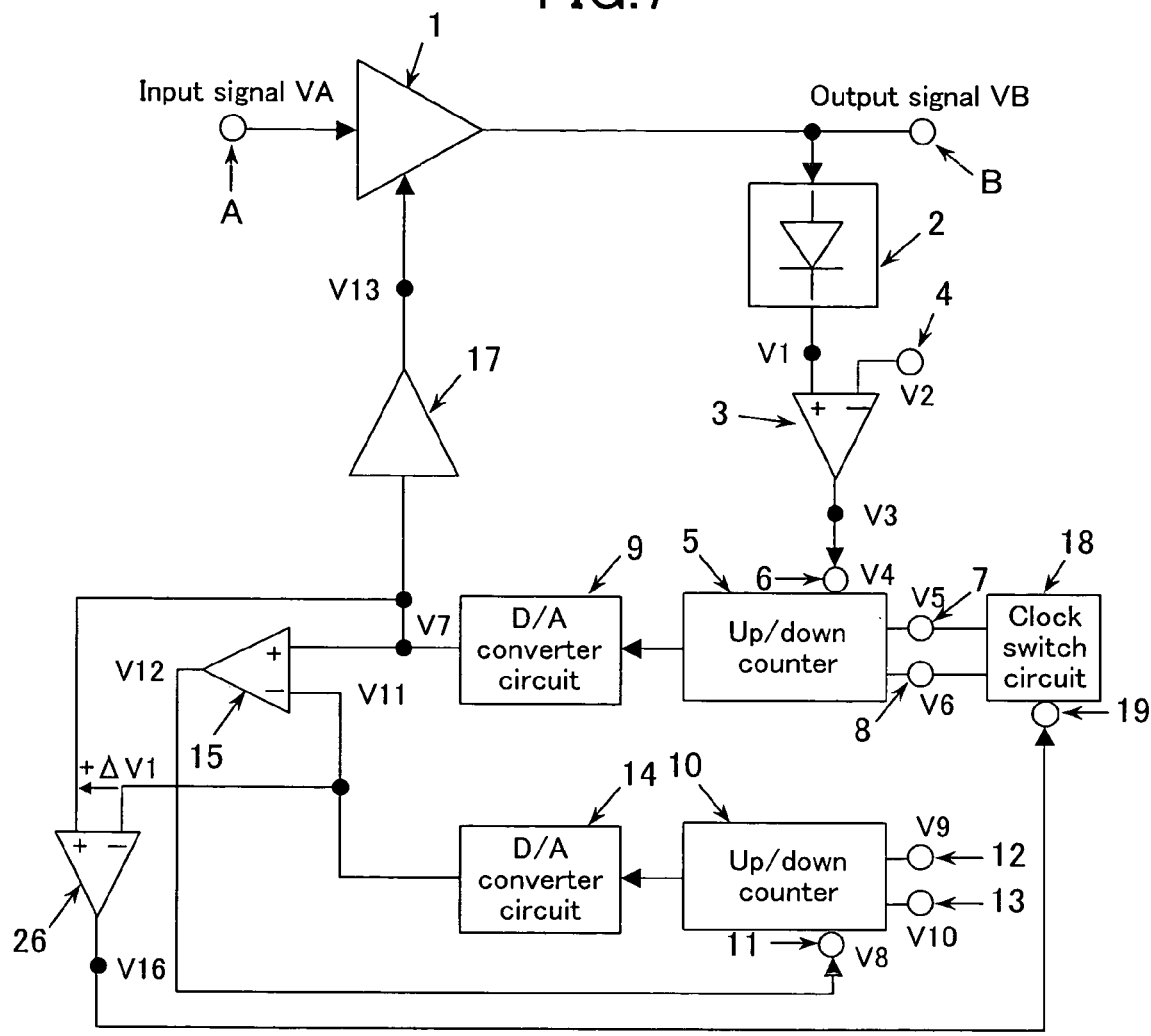
FIG. 7 is a block diagram illustrating a sixth embodiment of the AGC circuit of the present invention.

FIG. 7 is a block diagram illustrating an embodiment using an AGC circuit according to the present invention. In FIG. 7, each member of the embodiment using the AGC circuit of FIG. 1 according to the present invention is identified by the same reference numeral and therefore description thereof will be omitted. Only each member newly added to the AGC circuit of FIG. 1 will be described. The reference numeral 26 denotes a third voltage comparator for comparing the output voltage V7 of the D/A converter circuit 9 to the output voltage V11 of the D/A converter circuit 14. The third voltage comparator 26 outputs an voltage V16 at the high or low level according to a result from comparison between the voltages V7 and V11 and controls the operation of the clock switch circuit 18. Moreover, the voltage comparator 26 is intentionally made to have an offset of ΔV1. Accordingly, a voltage where V7=V11+ΔV1 holds becomes a threshold, so that the polarity of the output voltage 16 is reversed. In FIG. 7, where V7>V11+ΔV1 holds, the voltage V16 at the high level is outputs and where V7<V11+ΔV1 holds, the voltage V16 at the low level is output.

Hereinafter, the operation of the embodiment of the present invention, formed to have the above-described configuration, will be described.

The operation of the embodiment is the same as that of the embodiment of FIG. 1 of the present invention, except that the count operation clock frequency of the up/down counter 5 is switched by the clock switch circuit 18 at a different timing.

Assume that the AGC circuit of FIG. 1 according to the present invention is used in speech signal processing. Then, as described in Japanese Patent Application No. 2003-064980, it is assumed that a setting as an example is made so that the frequency of V5> the frequency of V9 holds, the frequency of V6−1> the frequency of V10 (≈the frequency of V6−2) holds in order to prevent increase in a time when a sound can not be heard or it is difficult to catch a sound until the amplitude of the sound is returned to a certain level because when sound is continuously input, a time when the amplitude of the sound is returned to a certain level follows the frequency of the clock V6 to be shortened or abrupt and big sound is input in a short time and then to output a speech signal having sound presence and perspective and no discomfort. If the above-described setting is made, even with change in an input signal, auditory influences with respect to time can be solved. On the other hand, some other auditory influence is caused when the amplitude is stable at a certain amplitude level. This phenomenon will be described with reference to FIGS. 8A through 8G.

Figure 8A:
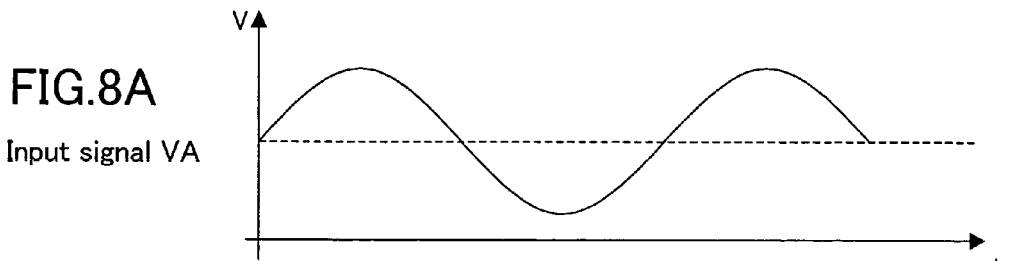
FIGS. 8A through 8G are waveform charts describing comparison between the respective operations of the AGC circuits of FIGS. 1 and 7.
Figure 8B:
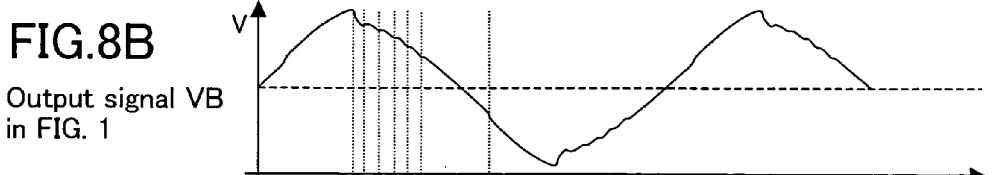
Figure 8C:
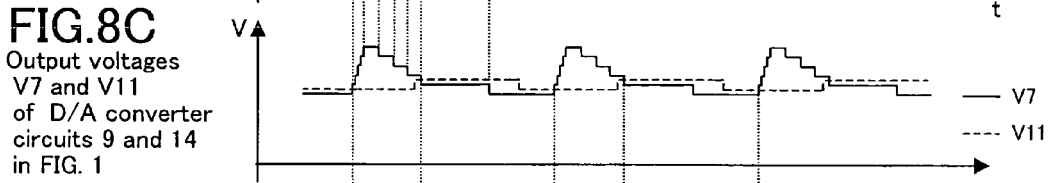
Figure 8D:
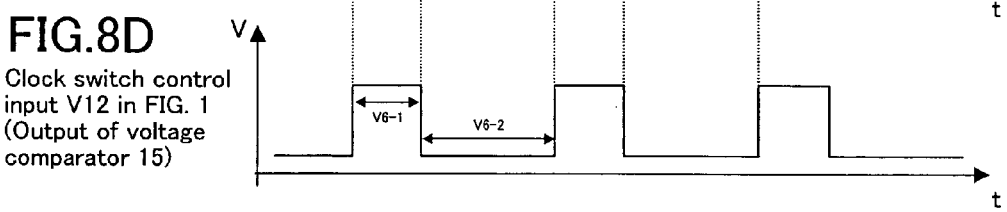
Figure 8E:
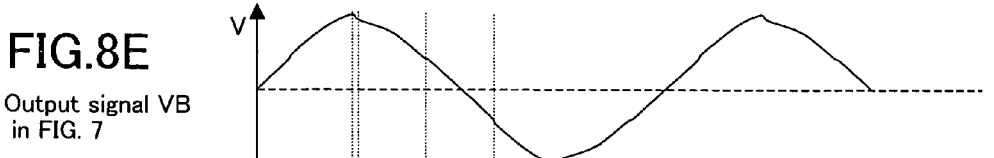
Figure 8F:

To emphasize the change, a waveform obtained when in the configuration of FIG. 1, a signal having the waveform of FIG. 8A is input and a signal at a certain amplitude level is output by the AGC circuit is distorted as shown in FIG. 8B. Diminishment by an up count and amplification by a down count balance out each other, so that the output signal converges to a certain amplitude level. However, in this case, a count is increased by the up count according to the amount of reduction in the count value C of the up/down counter 5 due to the down count, so that the up count and the down count balance out each other. When the count operation clock frequency is set in the above-described manner, the down count operation clock V6 of the up/down counter 5 is switched to V6−1 and V6−2, as shown in the waveform of FIG. 8D, via the clock switch circuit by the output signal V12 of the voltage comparator 15. Accordingly, each of the respective output voltages V7 and V11 of the D/A converter circuits 9 and 14 has the waveform of FIG. 8C. V7 is made to be the gain control voltage V13 of the variable gain amplifier circuit 1 by the direct current amplifier 17, so that the input signal VA is amplified or diminished to be the output signal VB having the waveform of FIG. 8B. This is because V5 and V6−1 at a high frequency exist when diminishment and amplification balance out each other and thus the variation width of a count is increased. With an increased variation width of a count value, for example, when the AGC circuit is used in speech signal processing, not only distortion of an output waveform but also the generation of some other sound than a sound which has been input in part in which a rapid change appears are caused. If the frequency of each of the respective frequencies of V5 and V6−1 is reduced to avoid this situation, due to change in the signal to be input, the auditory influence with respect to time is generated again. Therefore, the respective frequencies of V5 and V6−1 can not be reduced.

Figure 8G:
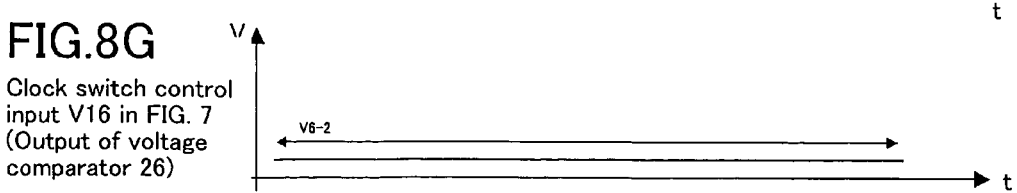

However, if the AGC circuit of FIG. 7 according to the present invention is used, the above-described phenomenon can be prevented with the same setting for each count operation clock frequency. The down count operation clock V6 of the up/down counter 5 is switched to V6−1 and V6−2 via the clock switch circuit 18 by the output signal V16 of the voltage comparator 26 as shown in the waveform of FIG. 8G, so that each of the respective output voltages V7 and V11 of the D/A converter circuits 9 and 14 has the waveform of FIG. 8F. V7 is made to be the gain control voltage V13 of the variable gain amplifier circuit 1 by the direct current amplifier 17 and the input signal VA is amplified or diminished to be the output signal VB having the waveform of FIG. 8E.

Figure 9:
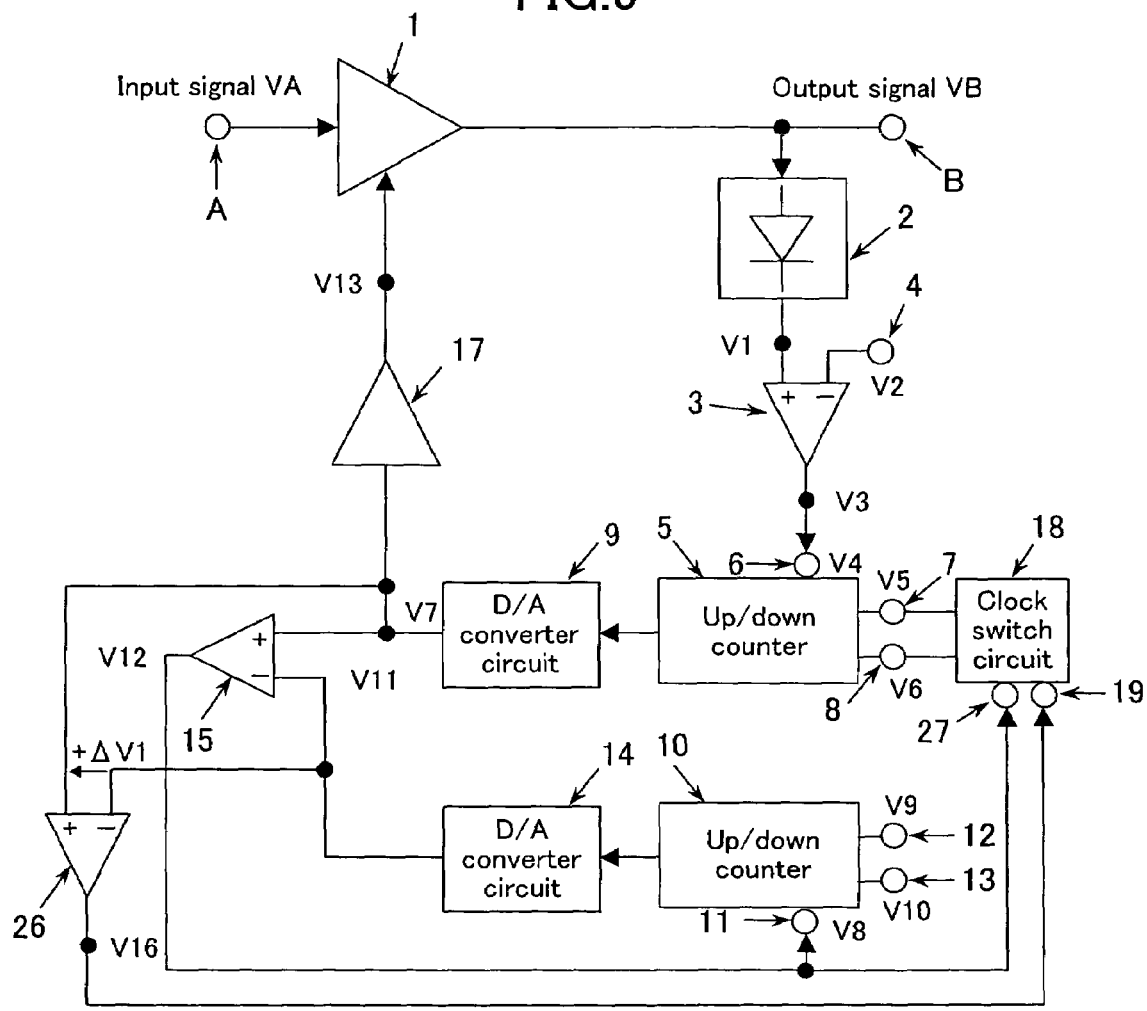
FIG. 9 is a block diagram illustrating an embodiment of the present invention with which the same effects as those of AGC circuit of FIG. 7 can be obtained.

In the above-described example, the configuration in which the down count clock V6 is switched by the output signal of the voltage comparator 26 is adopted. However, if with two count operation clock switch control input terminals provided in the clock switch circuit 18 as shown in FIG. 9, the output signal V12 of the voltage comparator 15 is used for switching to V6-1 and V6-2 in the same manner as in the embodiment of FIG. 1 while being used for performing control for switching the frequency of V5 by using the combination with the output signal V16 of the voltage comparator 26, and the frequency of V5 in an interval where V11<V7<V11+ΔV1 holds in a balanced state is reduced, the same effects as described above can be achieved.

Figure 10:
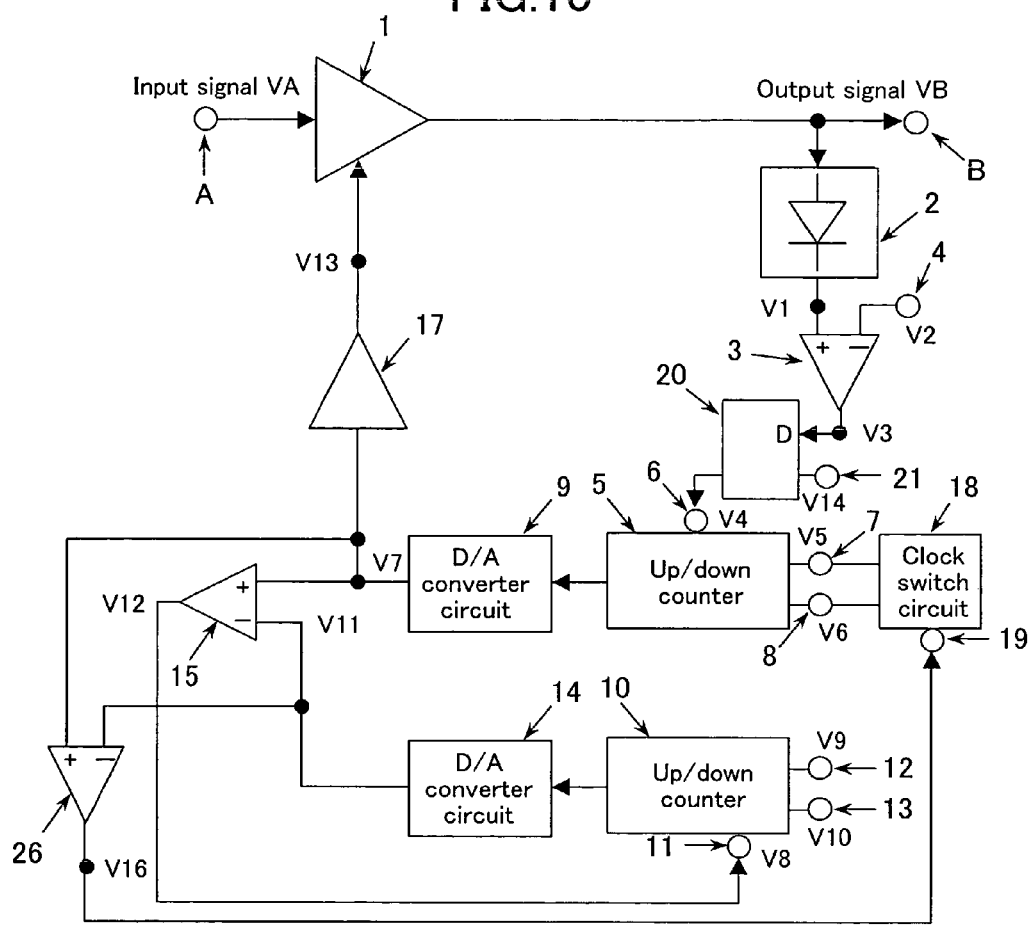
FIG. 10 is a block diagram illustrating a seventh embodiment of an AGC circuit of the present invention.
Figure 11:
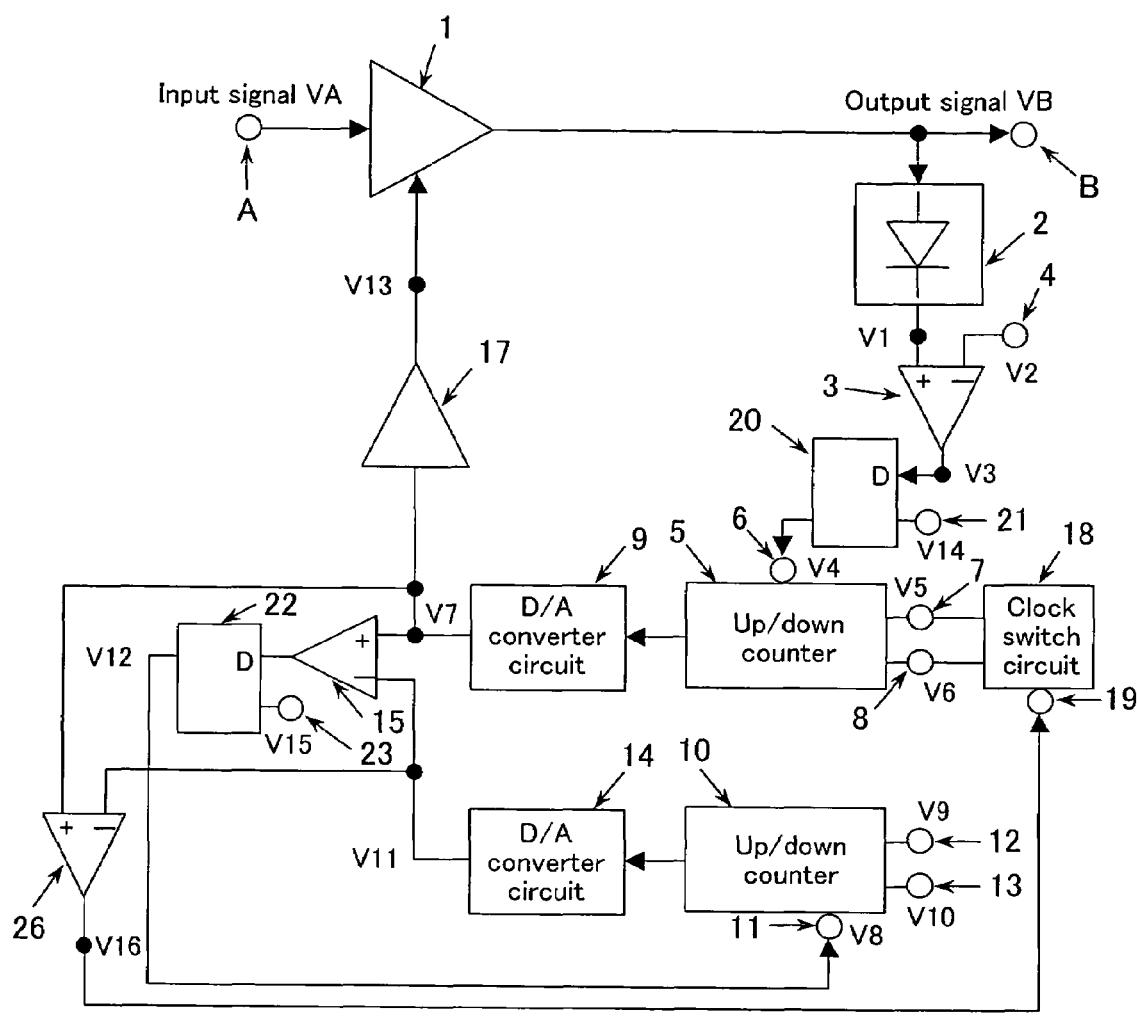
FIG. 11 is a block diagram illustrating an eighth embodiment of the AGC circuit of the present invention.

A configuration (of FIG. 10) obtained by adding the flipflop 20 of FIG. 3 to a configuration of the embodiment of FIG. 7, a configuration (of FIG. 11) obtained by further adding the flipflop 22 of FIG. 4 to a configuration of FIG. 10, and a configuration (of FIG. 12) obtained by further providing a register having the same configuration as that of the flipflop 22 between the voltage comparator 26 and the clock switch circuit 18 can be given as embodiments of the present invention.

Figure 13:
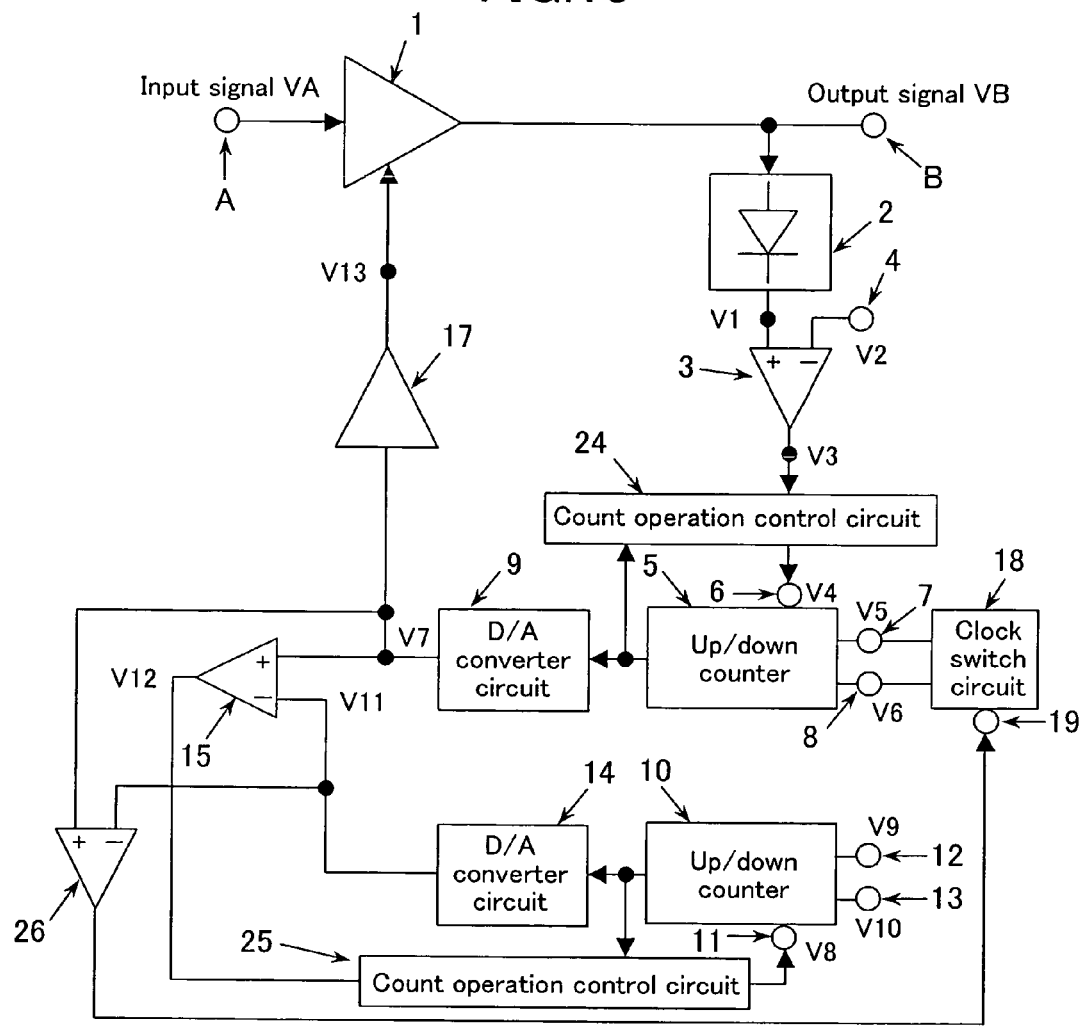
FIG. 13 is a block diagram illustrating a tenth embodiment of the AGC circuit of the present invention.

Moreover, a configuration (of FIG. 13) obtained by adding the count operation control circuits 24 and 25 of FIG. 5 to the configuration of the embodiment of FIG. 7 and a configuration obtained by providing functions corresponding to the count operation control circuits 24 and 25 built in the up/down counters 5 and 10, respectively, can be given as an embodiment of the present invention.

Figure 12:
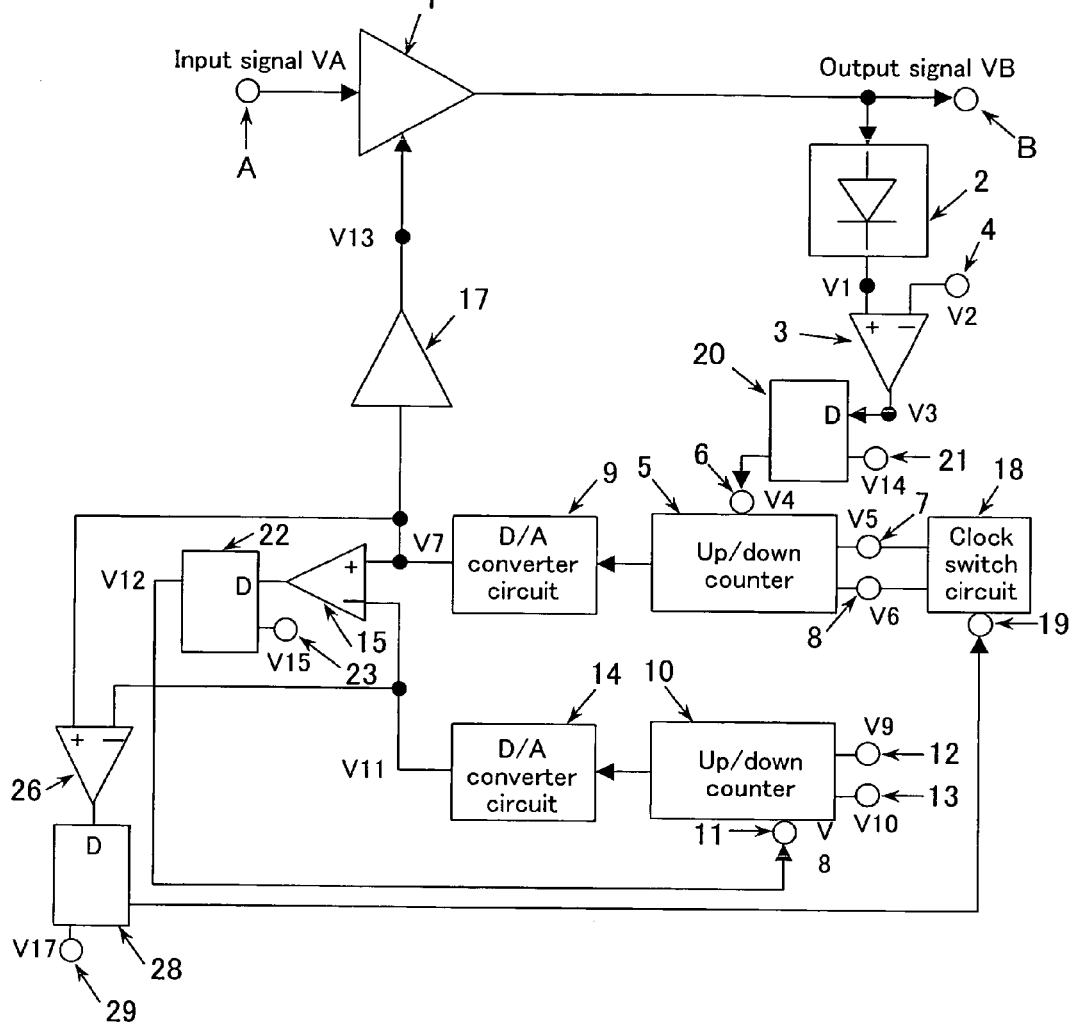
FIG. 12 is a block diagram illustrating a ninth embodiment of the AGC circuit of the present invention.
Figure 14:
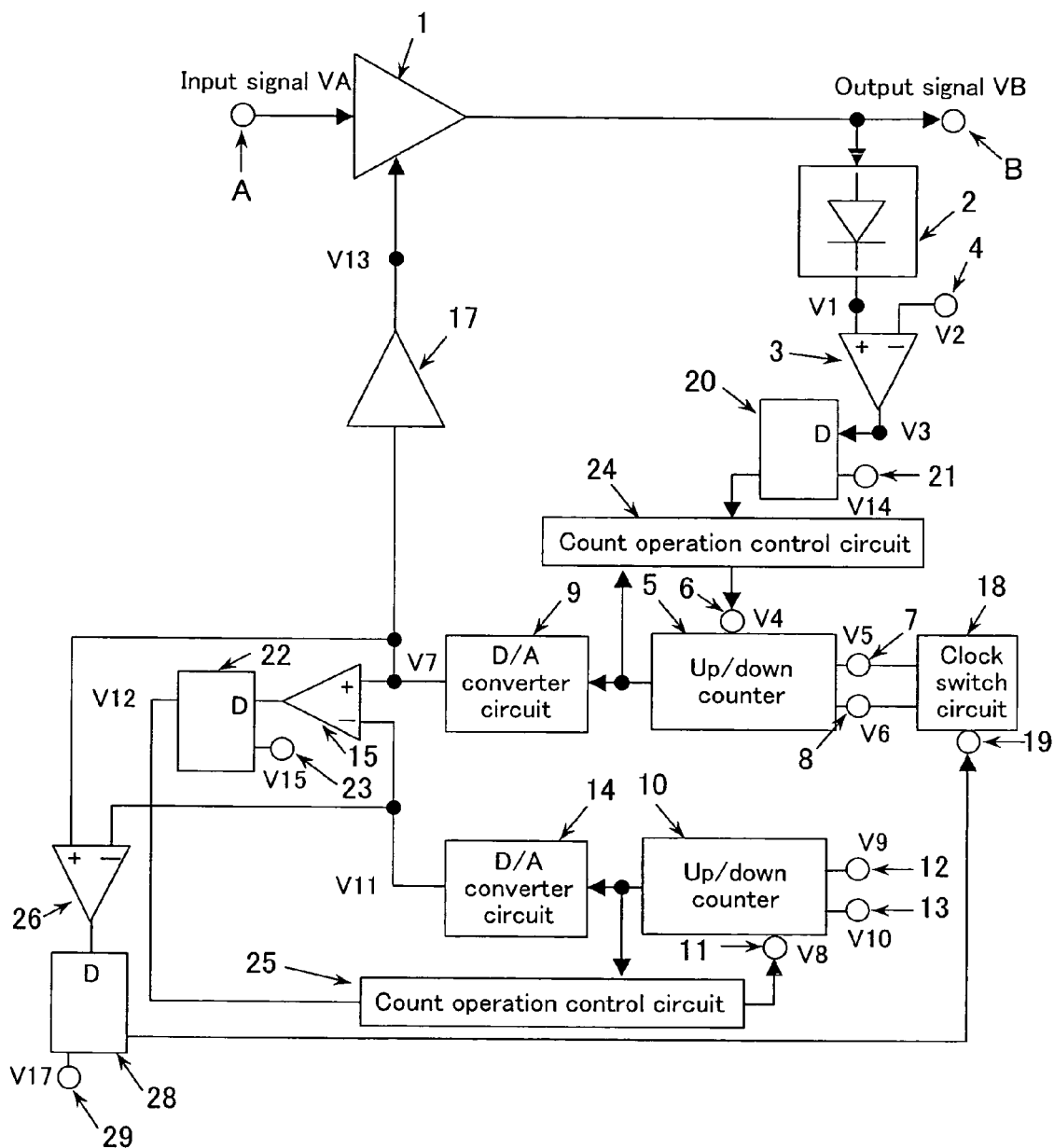
FIG. 14 is a block diagram illustrating an eleventh embodiment of the AGC circuit of the present invention.

Moreover, a configuration (of FIG. 14) obtained by adding the flipflops 20, 22 and 28 of FIG. 12 to the configuration of the embodiment of FIG. 7 and also adding the count operation control circuit 24 of FIG. 5 between the flipflop 20 and the up/down counter 5 and the count operation control circuit 25 of FIG. 5 between the flipflop 22 and the up/down counter 10 or a configuration obtained by adding the flipflops 20, 22 and 28 of FIG. 12 and also providing functions corresponding to the count operation control circuits 24 and 25 of FIG. 5 built in the up/down counters 5 and 10, respectively, can be given as an embodiment of the present invention.

Figure 15:
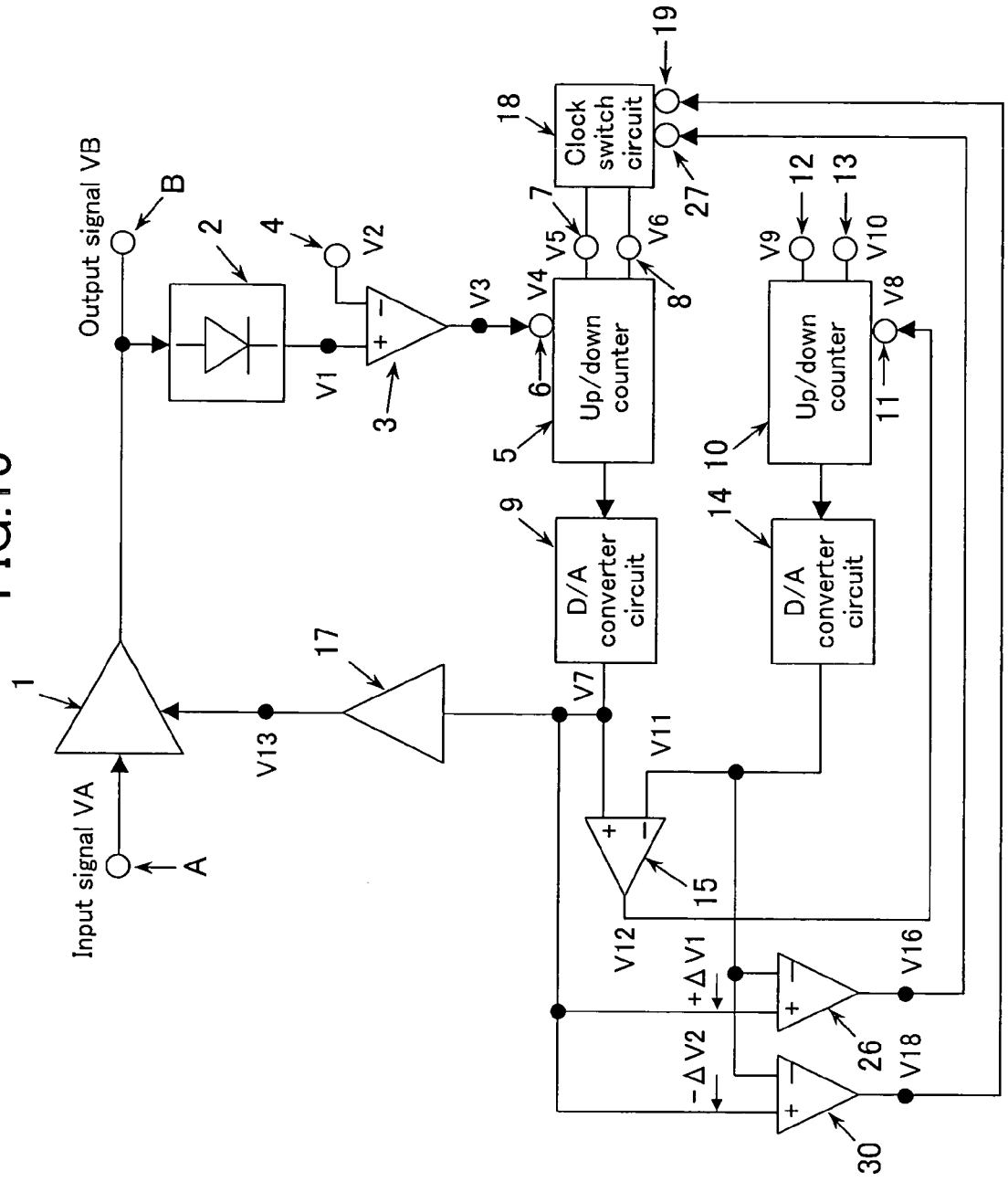
FIG. 15 is a block diagram illustrating a twelfth embodiment of the AGC circuit of the present invention.

FIG. 15 is a block diagram illustrating an embodiment using an AGC circuit according to the present invention. In FIG. 15, each member of the embodiment using the AGC circuit of FIG. 1 according to the present invention is identified by the same reference numeral and therefore description thereof will be omitted. Only each member newly added to the AGC circuit of FIG. 1 will be described. The reference numeral 30 denotes a fourth voltage comparator for comparing the output voltage V7 of the D/A converter circuit 9 to the output voltage V11 of the D/A converter circuit 14. The fourth voltage comparator 30 outputs the voltage V18 at the high or low level according to a result of comparison between the voltages V7 and V11. The reference numeral 27 denotes a second clock switch control input terminal of the clock switch circuit 18. The output voltage V16 of the voltage comparator 26 is received at the clock switch control input terminal 27 and the output voltage 18 of the voltage comparator 30 is received at the first clock switch control input terminal 19, thereby controlling the operation of the clock switch circuit 18. Moreover, the voltage comparator 26 is intentionally made to have an offset of ΔV1 and a voltage where V7=V11+ΔV1 holds becomes a threshold, so that the polarity of the output voltage V16 is reversed. In FIG. 15, where V7>V11+ΔV1 holds, the voltage V16 at the high level is output, and where V7<V11+ΔV1 holds, the voltage V16 at the low level is output. In the same manner, the voltage comparator 31 is intentionally made to have an offset of −ΔV2 and a voltage where V7=V11−ΔV2 holds becomes a threshold, so that the polarity of the output voltage V18 is reversed. In FIG. 15, where V7>V11 −ΔV2 holds, the voltage V18 at the high level is output and where V7<V11−ΔV2 holds, the voltage V18 at the low level is output.

Hereinafter, the operation of the embodiment of the present invention, formed to have the above-described configuration, will be described.

The basic operation of the embodiment is the same as that of the embodiment of FIG. 1 of the present invention, except that a timing of switching the count operation clock frequency of the up/down counter 5 by the clock switch circuit 18 is controlled by the voltage comparators 26 and 30.

With the AGC circuit of FIG. 7 according to the present invention, an excellent AGC circuit in terms of auditory properties can be provided. However, in the following cases, distortion of an output waveform to be caused when an amplitude is stable at a certain amplitude appears. A first case is a case where although a cycle of an input signal normally includes two intervals of an up count operation, the cycle includes an interval of the up count operation due to an offset of the variable gain amplifier circuit 1. A second case is a case where the rectifier circuit 2 is a half-wave rectifier circuit. A third case is a case where an input signal has a low frequency. A common point to the three cases is that a down count operation interval is prolonged and this point will be described with reference to FIGS. 16A through 16G.

When in the configuration of FIG. 7, a signal having the waveform of FIG. 16A is input and, for example, a cycle includes only an up count operation interval due to an offset of the variable gain amplifier circuit 1 in the manner described above, diminishment of the up count and amplification of the down count balance out each other, as has been described above, so that the output signal converges to a certain amplitude level. However, with the down count operation interval prolonged, the count down width of the count value C due to the down count operation is increased. Accordingly, the count up width of the count value C due to the down count operation is also increased, so that each of the respective output voltages V7 and V11 of the D/A converter circuits 9 and 14 has the waveform of FIG. 16C. V7 is made to be the gain control voltage V13 of the variable gain amplifier circuit 1 by the direct current amplifier 17 and the input signal VA is amplified or diminished. However, the variation width of V7 is large and thus the output signal VB has a distorted waveform of FIG. 16B. Also in each of the second and third cases, the down count operation interval is prolonged, so that a distorted waveform is output in the same manner. If the frequency of V5 is reduced to avoid this situation, an attack time is prolonged and the response property when there is some change in an input signal is deteriorated. Moreover, when the frequency of V6-2 is reduced, a recovery time is prolonged. Then, when the frequency of V6-2 is reduced too much and thus the input signal becomes smaller, a time which it takes for an amplitude to be returned to a certain level is increased. Therefore, in the case of a speech signal, an auditory influence in which a time when a sound can not be heard or it is difficult to catch a sound is increased is generated again.

To prevent the above-described phenomenon, for example, the frequency of V6 may be switched to the frequency of V6-3, i.e., an even lower frequency only when the output signal is stable at a constant amplitude. With use of the AGC circuit of FIG. 15 according to the present invention, the above-described phenomenon can be prevented without changing the response property.

In the embodiment of FIG. 15, according to the respective polarities of the output voltages V16 and V18 of the voltage comparators 26 and 30, in the clock switch circuit 18, the frequency of the down count operation clock V6 of the up/down counter 5 is switched to V6–1, V6–2, and V6–3, as shown in FIG. 16D, and the relationship among the frequencies can be expressed by the frequency of V6–1> the frequency of V6–2> the frequency of V6–3. When the clock is switched in the manner shown in FIG. 16D, the relationship between the respective frequencies of the output voltages of V7 and V11 of the D/A converter circuits 9 and 14 can be expressed by FIG. 16E. With this configuration, when a signal having the waveform of FIG. 16A is input, each of V7 and V1 has the waveform of FIG. 16G. In a state where an up count and down count balance out each other, the down count operation of V7 follows up the frequency of V6–3, so that the variation width due to the down count operation is reduced. As a result, the variation width due to the up count operation is also reduced, so that distortion of the output signal VB can be improved as shown in the waveform of FIG. 16F.

The switching of the clock frequency in the above-described manner is also possible in the configuration of FIG. 9. In the configuration of FIG. 9, the switching may be performed so that where V7>V11+ΔV1 holds, the frequency is set to be V6–1, where V11<V7<V11+ΔV1 holds, the frequency is set to be V6–3, and where V7<V11 holds, the frequency is set to be V6–2. However, in the configuration of FIG. 9, even when the output signal VB is stable at a certain amplitude level, the magnitude relation between V7 and V11 is reversed. Accordingly, as the magnitude relation is reversed, the frequency is switched between V6–2 and V6–3, so that the down count operation is performed more often than in FIG. 15. Therefore, in terms of distortion of the output waveform, the configuration of FIG. 15 is more excellent.

Figure 17:
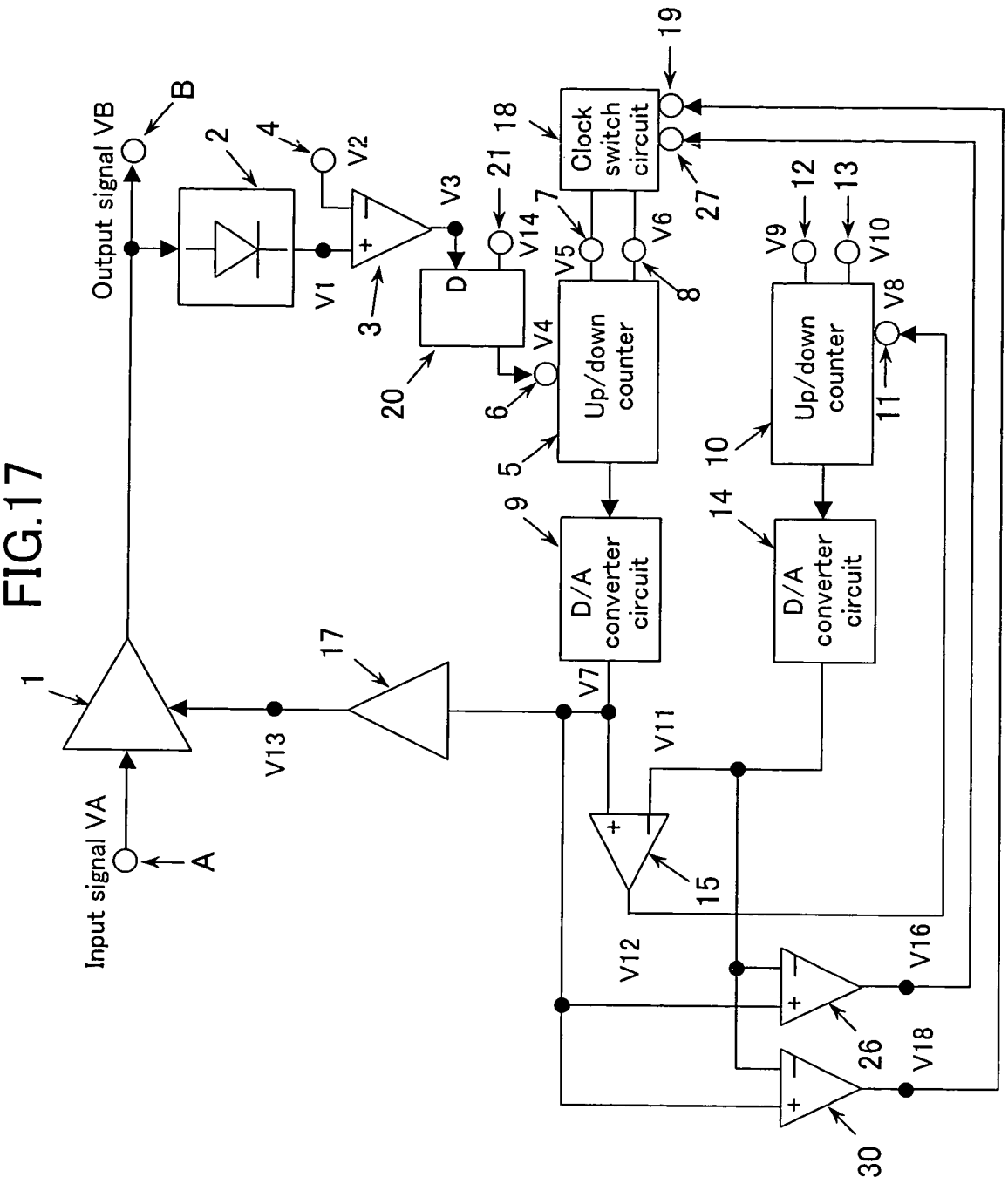
FIG. 17 is a block diagram illustrating a thirteenth embodiment of the AGC circuit of the present invention.
Figure 18:
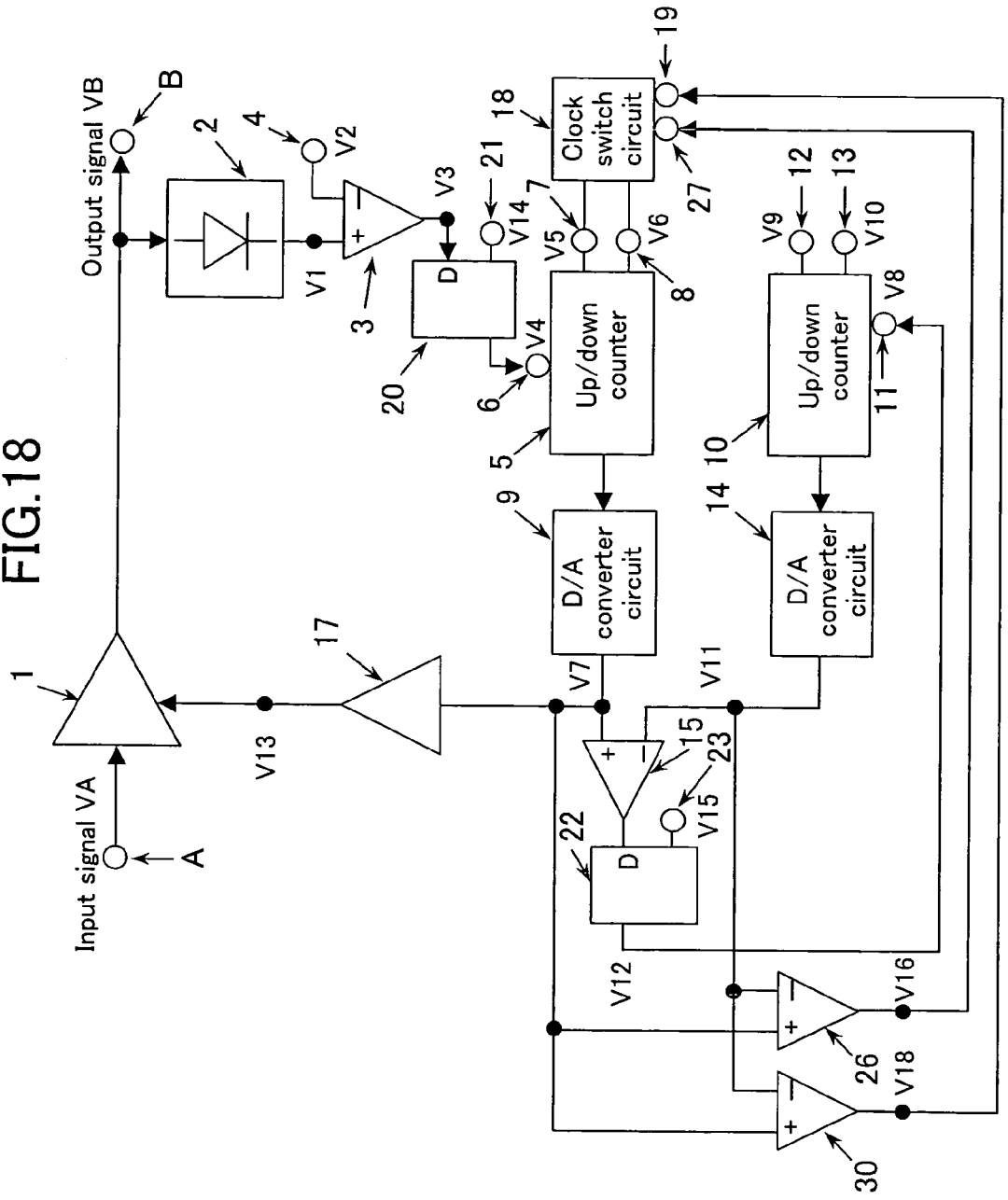
FIG. 18 is a block diagram illustrating a fourteenth embodiment of the AGC circuit of the present invention.

A configuration (of FIG. 17) obtained by adding the flipflop 20 of FIG. 3 to the configuration of the embodiment of FIG. 15, the configuration (of FIG. 18) obtained by further adding the flipflop 22 of FIG. 4 to the configuration (of FIG. 17) and a configuration (of FIG. 19) in which a resistor having the same configuration as that of the flipflop 22 is provided between the voltage comparator 26 and the clock switch circuit 18 and between the voltage comparator 30 and the clock switch circuit 18 can be given as embodiments of the present invention.

Figure 20:
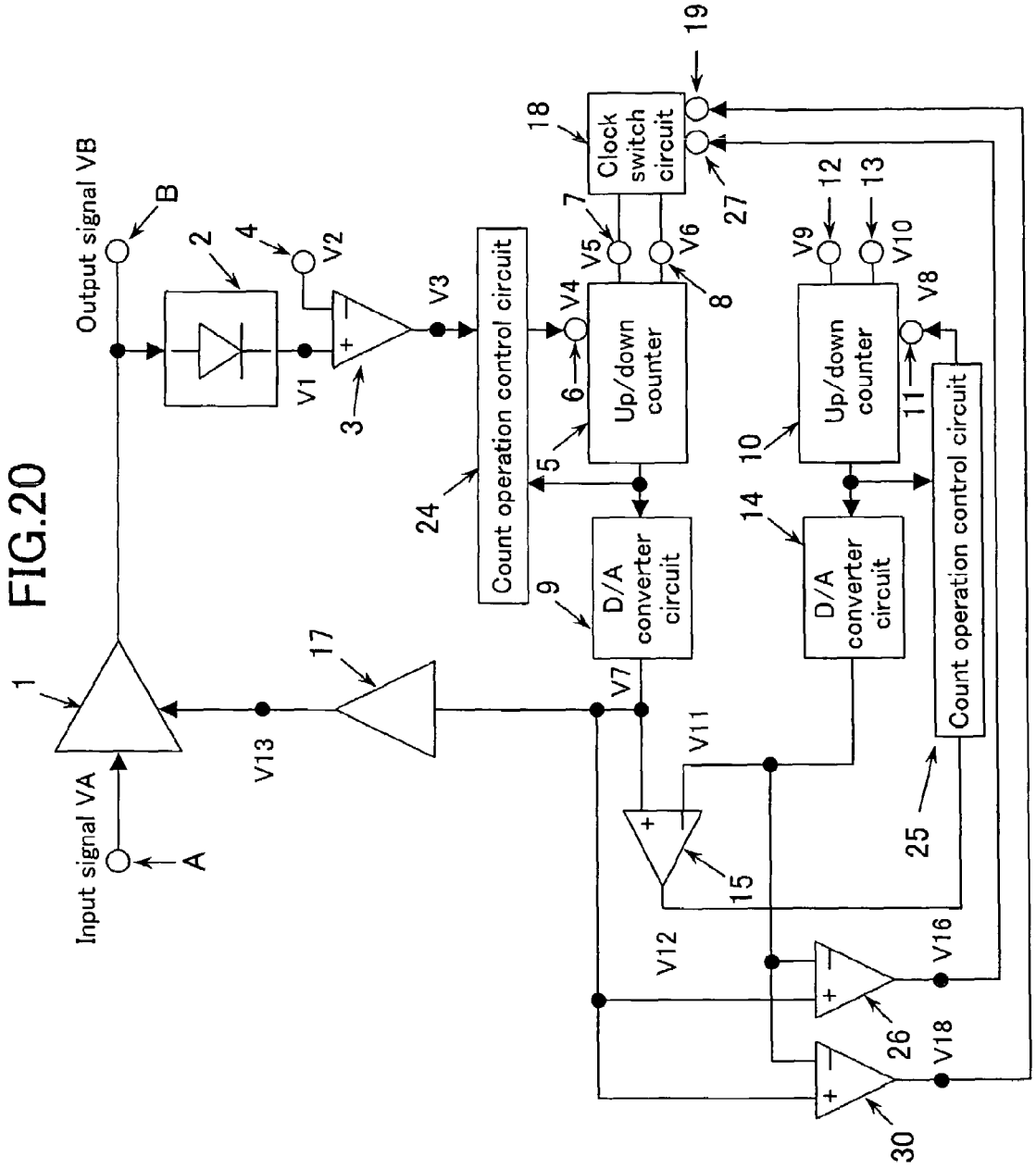
FIG. 20 is a block diagram illustrating a sixteenth embodiment of the AGC circuit of the present invention.

Moreover, a configuration (of FIG. 20) obtained by adding the count operation control circuits 24 and 25 of FIG. 5 to the configuration of the embodiment of FIG. 15 and a configuration obtained by providing functions corresponding to the count operation control circuits 24 and 25 built in the up/down counters 5 and 10, respectively, can be given as embodiments of the present invention.

Figure 19:
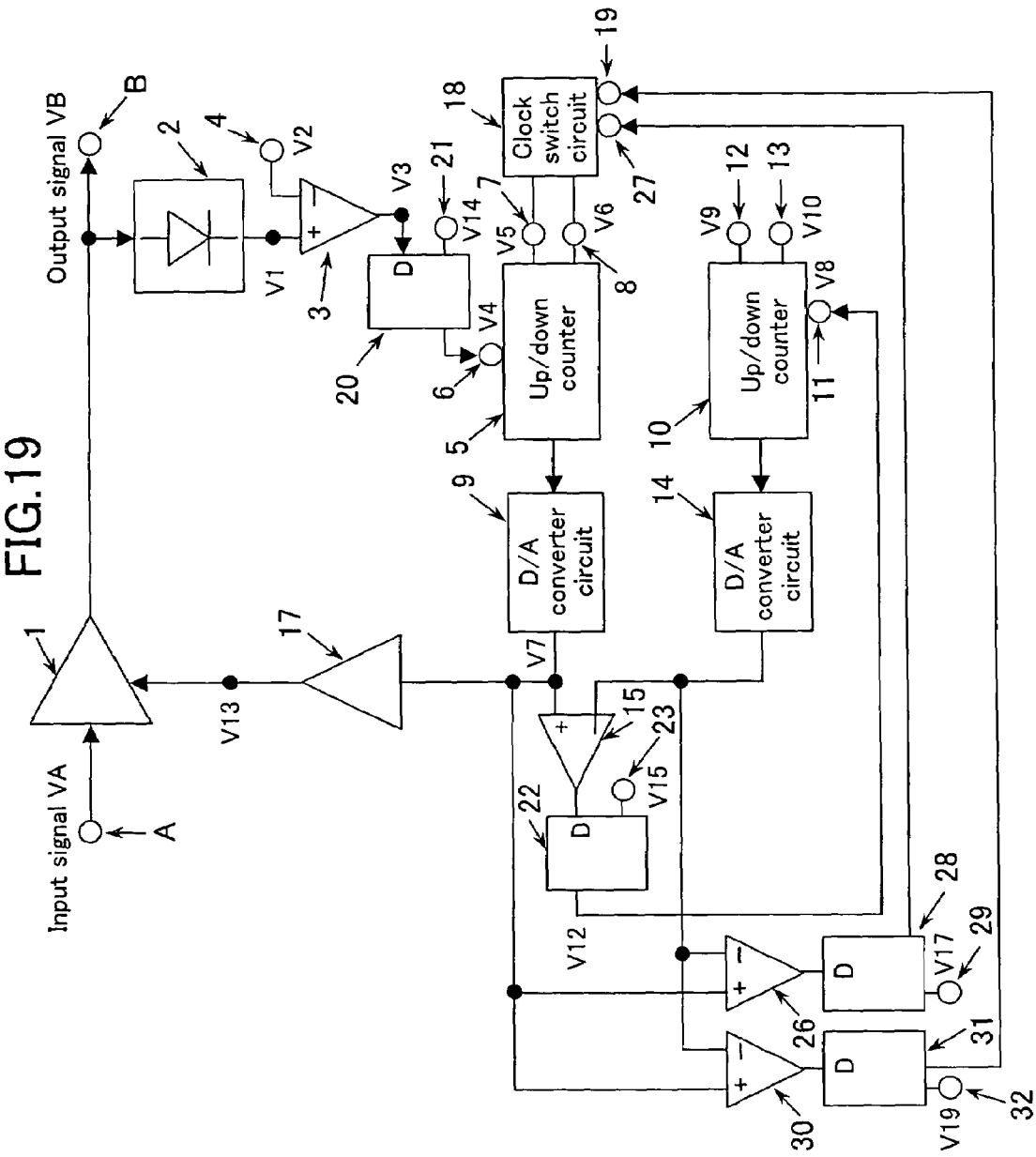
FIG. 19 is a block diagram illustrating a fifteenth embodiment of the AGC circuit of the present invention.
Figure 21:
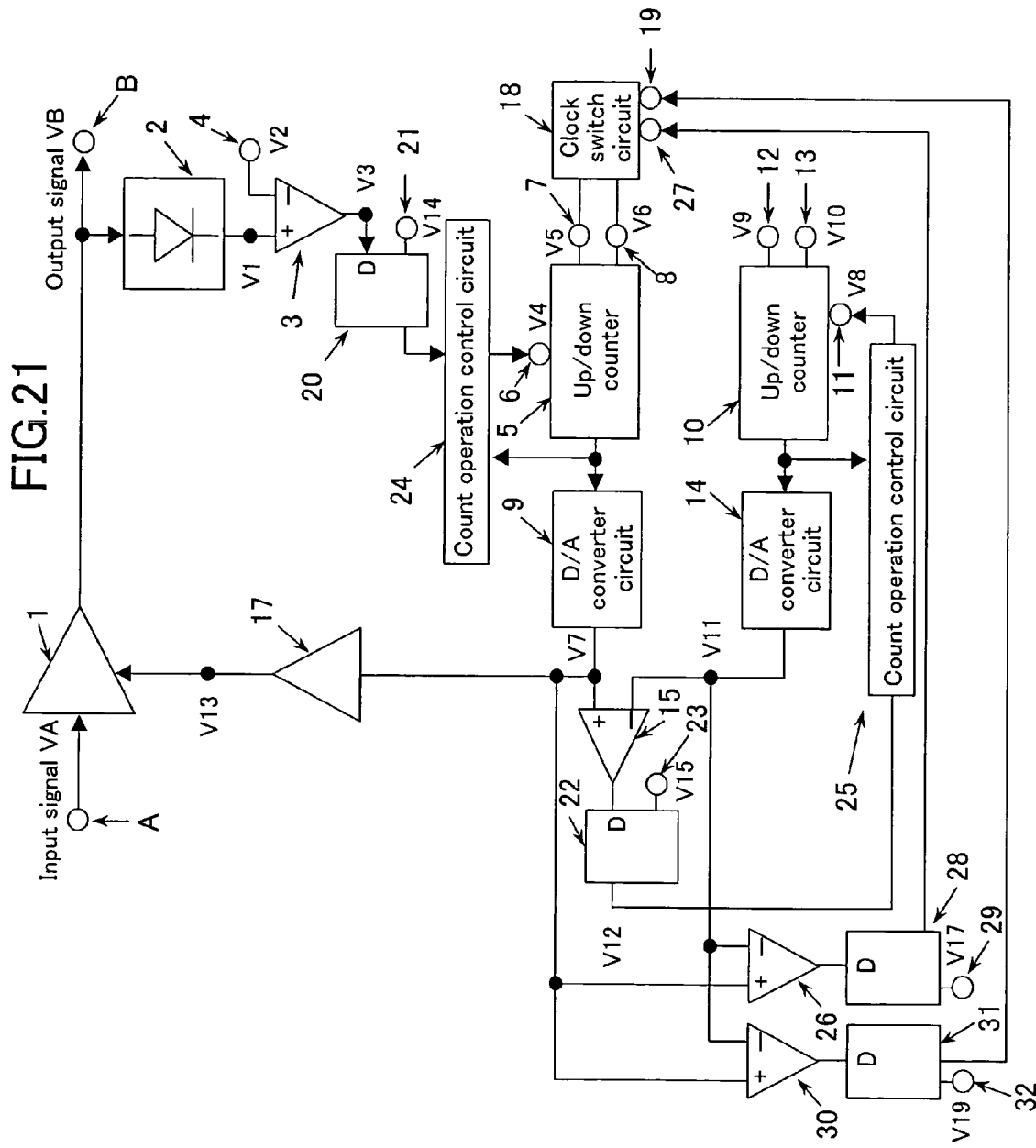
FIG. 21 is a block diagram illustrating a seventeenth embodiment of an AGC circuit of the present invention.

Moreover, a configuration (of FIG. 21) obtained by adding the flipflops 20, 22 and 28 of FIG. 19 to the configuration of the embodiment of FIG. 15 and also adding the count operation control circuit 24 of FIG. 5 between the flipflop 20 and the up/down counter 5 and the count operation control circuit 25 of FIG. 5 between the flipflop 22 or a configuration obtained by adding the flipflops 20, 22, 28 and 30 of FIG. 19 and also providing functions corresponding to the count operation control circuits 24 and 25 built in the up/down counters 5 and 10, respectively, can be given as embodiments of the present invention.

Specific embodiments of the present invention have been described in detail. However, the present invention is not limited to these embodiments, but a variety of modification can be made without going out of the technical scope of the present invention.

What is claimed is:

1. An AGC circuit comprising:
   a variable gain amplifier circuit having a gain controlled by a gain control signal;
   a rectifier circuit for rectifying an output signal of the variable gain amplifier circuit;
   a first voltage comparator for comparing a rectified signal rectified by the rectifier circuit with a voltage arbitrarily set beforehand;
   a first up/down counter for switching between an up count operation and a down count operation according to a level of an output voltage of the first voltage comparator;
   a first D/A converter circuit for outputting a voltage according to a count value of the first up/down counter;
   a second up/down counter for switching between an up count operation and a down count operation according to a level of an output voltage of a second voltage comparator;
   a second D/A converter circuit for outputting a voltage according to a count value of the second up/down counter;
   a second voltage comparator for comparing an output voltage of the first D/A converter circuit with an output voltage of the second D/A converter circuit; and
   a clock switch circuit for switching a count operation clock frequency of the first up/down counter based on the level of the output voltage of the second voltage comparator,
   wherein a gain control signal according to the output voltage of the first D/A converter circuit is supplied to the variable gain amplifier circuit.

2. The AGC circuit of claim 1,
   wherein a first register is provided between the first voltage comparator and the first up/down counter, and
   wherein the AGC circuit is configured for storing the output voltage of the first voltage comparator in the first register with a cycle of a first reference clock, switching an operation of the first up/down counter between the up count operation and the down count operation according to a level of the voltage stored in the first register, and not transmitting a change in the output voltage of the first voltage comparator in a shorter period than the cycle of the first reference clock is transmitted to the first up/down counter.

3. The AGC circuit of any one of claims 1 and 2,
   wherein a second register is provided between the second voltage comparator and the second up/down counter, and
   wherein the AGC circuit is configured for storing the output voltage of the second voltage comparator in the second register with a cycle of a second reference clock, switching an operation of the second up/down counter between the up count operation and the down count operation according to a level of the voltage stored in the second register, and not transmitting a change in the output voltage of the second voltage comparator in a shorter period than the cycle of the second reference clock to the second up/down counter.

4. The AGC circuit of claim 1,
wherein a first count operation control circuit is provided between the first voltage comparator and the first up/down counter,
wherein according to the count value of the first up/down counter, the AGC circuit transmits the output voltage of the first voltage comparator to the first up/down counter or cuts off a transmission of the output voltage, thereby limiting the count value of the first up/down counter to within a range from a predetermined first upper limit value to a predetermined first lower limit value,
wherein a second count operation control circuit is provided between the second voltage comparator and the second up/down counter, and
wherein according to the count value of the second up/down counter, the AGC circuit transmits the output voltage of the second voltage comparator to the second up/down counter or cuts off a transmission of the output voltage, thereby limiting the count value of the second up/down counter to within a range from a predetermined second upper limit value to a predetermined second lower limit value.

5. The AGC circuit of claim 3,
wherein a first count operation control circuit is provided between the first register and the first up/down counter,
wherein according to the count value of the first up/down counter, the AGC circuit transmits the output voltage of the first register to the first up/down counter or cuts off a transmission of the output, thereby limiting the count value of the first up/down counter to within a range from a predetermined first upper limit value and a predetermined first lower limit value,
wherein a second count operation circuit is provided between the second register and the second up/down counter, and
wherein according to the count value of the second up/down counter, the AGC circuit transmits the output voltage of the second register or cuts off a transmission of the output, thereby limiting the count value of the second up/down counter to within a range from a predetermined second upper limit value to a predetermined second lower limit value.

6. The AGC circuit of any one of claims 1 and 2,
wherein the first up/down counter has the function of limiting the count value to within a range from a predetermined first upper limit value to a first lower limit value by executing the up count operation or stopping an execution of the up count operation according to the count value while executing a down count operation or stopping an execution of the down count operation according to the count value, and
wherein the second up/down counter has the function of limiting the count value to within a range from a predetermined second upper limit value to a second lower limit value by executing the up count operation or stopping the execution according to the count value while executing a down count operation or stopping the execution according to the count value.

7. An AGC circuit comprising:
a variable gain amplifier circuit having a gain controlled by a gain control signal;
a rectifier circuit for rectifying an output signal of the variable gain amplifier circuit;
a first voltage comparator for comparing a rectified signal rectified by the rectifier circuit with a voltage arbitrarily set beforehand;
a first up/down counter for switching between an up count operation and a down count operation according to a level of an output voltage of the first voltage comparator;
a first D/A converter circuit for outputting a voltage according to the count value of the first up/down counter;
a second up/down counter for switching between an up count operation and a down count operation according to a level of output voltage of the second voltage comparator;
a second D/A converter circuit for outputting a voltage according to a count value of the second up/down counter;
second and third voltage comparators for comparing an output voltage of the first D/A converter circuit with an output voltage of the second D/A converter circuit; and
a clock switch circuit for switching a count operation clock frequency of the first up/down counter based on a level of an output voltage of the third voltage comparator,
wherein a gain control signal according to the output voltage of the first D/A converter circuit is supplied to the variable gain amplifier circuit.

8. The AGC circuit of claim 7,
wherein a first register is provided between the first voltage comparator and the first up/down counter, and
wherein the AGC circuit is configured for storing the output voltage of the first voltage comparator in the first register with a cycle of a first reference clock, switching an operation of the first up/down counter between the up count operation and the down count operation according to a level of the voltage stored in the first register, and not transmitting a change in the output voltage of the first voltage comparator in a shorter period than the cycle of the first reference clock to the first up/down counter.

9. The AGC circuit of any one of claims 7 and 8,
wherein a second register is provided between the second voltage comparator and the second up/down counter, and
wherein the AGC circuit is configured for storing the output voltage of the second voltage comparator in the second register with a cycle of a second reference clock, switching an operation of the second up/down counter between the up count operation and the down count operation according to a level of the voltage stored in the second register, and not transmitting a change in the output voltage of the second voltage comparator in a shorter period than the cycle of the second reference clock is transmitted to the second up/down counter.

10. The AGC circuit of any one of claims 7 and 8,
wherein a third register is provided between the third voltage comparator and the clock switch circuit, and
wherein the AGC circuit is configured for storing the output voltage of the third voltage comparator in the third register with a cycle of a third reference clock, controlling an operation of the clock switch circuit according to a level of the voltage stored in the third register, and not transmitting a change in an output voltage of the third voltage comparator in a shorter period than the cycle of the third reference clock to the clock switch circuit.

11. The AGC circuit of claim 7,
wherein a first count operation control circuit is provided between the first voltage comparator and the first up/down counter,
wherein according to the count value of the first up/down counter, the AGC circuit transmits the output voltage of the first voltage comparator to the first up/down counter or cuts off a transmission of the output voltage, thereby limiting the count value of the first up/down counter to within a range from a predetermined first upper limit value to a predetermined first lower limit value,
wherein a second count operation control circuit is provided between the second voltage comparator and the second up/down counter, and
wherein according to the count value of the second up/down counter, the AGC circuit transmits the output voltage of the second voltage comparator to the second up/down counter or cuts off a transmission of the output voltage, thereby limiting the count value of the second up/down counter to within a range from a predetermined second upper limit value to a predetermined second lower limit value.

12. The AGC circuit of claim 10,
wherein a first count operation control circuit is provided between the first register and the first up/down counter,
wherein according to the count value of the first up/down counter, the AGC circuit transmits the output voltage of the first register to the first up/down counter or cuts off a transmission of the output, thereby limiting the count value of the first up/down counter to within a range from a predetermined first upper limit value and a predetermined first lower limit value,
wherein a second count operation circuit is provided between the second register and the second up/down counter, and
wherein according to the count value of the second up/down counter, the AGC circuit transmits the output voltage of the second register or cuts off a transmission of the output, thereby limiting the count value of the second up/down counter to within a range from a predetermined second upper limit value to a predetermined second lower limit value.

13. The AGC circuit of any one of claims 7 and 8,
wherein the first up/down counter has the function of limiting the count value to within a range from a predetermined first upper limit value to a first lower limit value by executing the up count operation or stopping an execution of the up count operation according to the count value while executing a down count operation or stopping an execution of the down count operation according to the count value, and
wherein the second up/down counter has the function of limiting the count value to within a range from a predetermined second upper limit value to a second lower limit value by executing the up count operation or stopping an execution of the up count operation according to the count value while executing a down count operation or stopping an execution of the down count operation according to the count value.

14. An AGC circuit comprising:
a variable gain amplifier circuit having a gain controlled by a gain control signal;
a rectifier circuit for rectifying an output signal of the variable gain amplifier circuit;
a first voltage comparator for comparing a rectified signal rectified by the rectifier circuit with a voltage arbitrarily set beforehand;
a first up/down counter for switching between an up count operation and a down count operation according to a level of an output voltage of the first voltage comparator;
a first D/A converter circuit for outputting a voltage according to a count value of the first up/down counter;
a second up/down counter for switching between an up count operation and a down count operation according to a level of an output voltage of a second voltage comparator;
a second D/A converter circuit for outputting a voltage according to a count value of the second up/down counter;
second, third and fourth voltage comparators for comparing an output voltage of the first D/A converter circuit with an output voltage of the second D/A converter circuit; and
a clock switch circuit for switching a count operation clock frequency of the first up/down counter based on the respective levels of the output voltages of the third and fourth voltage comparators,
wherein a gain control signal according to the output voltage output of the first D/A converter circuit is supplied to the variable gain amplifier circuit.

15. The AGC circuit of claim 14,
wherein a first register is provided between the first voltage comparator and the first up/down counter, and
wherein the AGC circuit is configured for storing the output voltage of the first voltage comparator in the first register with a cycle of a first reference clock, switching an operation of the first up/down counter between the up count operation and the down count operation according to a level of the voltage stored in the first register, and not transmitting a change in the output voltage of the first voltage comparator in a shorter period than the cycle of the first reference clock to the first up/down counter.

16. The AGC circuit of any one of claims 14 and 15,
wherein a second register is provided between the second voltage comparator and the second up/down counter, and
wherein the AGC circuit is configured for storing the output voltage of the second voltage comparator in the second register with a cycle of a second reference clock, switching an operation of the second up/down counter between the up count operation and the down count operation according to a level of the voltage stored in the second register, and not transmitting a change in the output voltage of the second voltage comparator in a shorter period than the cycle of the second reference clock to the second up/down counter.

17. The AGC circuit of any one of claims 14 and 15,
wherein third and fourth registers are provided between the third voltage comparator and the clock switch circuit and between the fourth voltage comparator and the clock switch circuit, respectively,
wherein the AGC circuit is configured for storing the output voltage of the third voltage comparator in the third resistor with a cycle of a third reference clock and the output voltage of the fourth voltage comparator in the fourth register with a cycle of a fourth reference clock, controlling the operation of the clock switch circuit according to respective levels of the voltages stored in the third and fourth resistors, and not transmitting a change in the output voltage of the third voltage comparator in a shorter period than the cycle of the third reference clock and in the output voltage of the fourth voltage comparator in a shorter period than the cycle of the fourth reference clock to the clock switch circuit.

18. The AGC circuit of claim 14,
wherein a first count operation control circuit is provided between the first voltage comparator and the first up/down counter,
wherein according to the count value of the first up/down counter, the AGC circuit transmits the output voltage of the first voltage comparator to the first up/down counter or cuts off a transmission of the output voltage, thereby limiting the count value of the first up/down counter to within a range from a predetermined first upper limit value to a predetermined first lower limit value,
wherein a second count operation control circuit is provided between the second voltage comparator and the second up/down counter, and
wherein according to the count value of the second up/down counter, the AGC circuit transmits the output voltage of the second voltage comparator to the second up/down counter or cuts off a transmission of the output voltage, thereby limiting the count value of the second up/down counter to within a range from a predetermined second upper limit value to a predetermined second lower limit value.

19. The AGC circuit of claim 17,
wherein a first count operation control circuit is provided between the first register and the first up/down counter,
wherein according to the count value of the first up/down counter, the AGC circuit transmits the output voltage of the first register to the first up/down counter or cuts off a transmission of the output, thereby limiting the count value of the first up/down counter to within a range from a predetermined first upper limit value and a predetermined first lower limit value,
wherein a second count operation circuit is provided between the second register and the second up/down counter, and
wherein according to the count value of the second up/down counter, the AGC circuit transmits the output voltage of the second register or cuts off a transmission of the output, thereby limiting the count value of the second up/down counter to within a range from a predetermined second upper limit value to a predetermined second lower limit value.

20. The AGC circuit of any one of claims 14 and 15,
wherein the first up/down counter has the function of limiting the count value to within a range from a predetermined first upper limit value to a first lower limit value by executing the up count operation or stopping an execution of the up count operation according to the count value while executing a down count operation or stopping an execution of the down count operation according to the count value, and
wherein the second up/down counter has the function of limiting the count value to within a range from a predetermined second upper limit value to a second lower limit value by executing the up count operation or stopping an execution of the up count operation according to the count value while executing a down count operation or stopping an execution of the down count operation according to the count value.

* * * * *